United States Patent [19]

Yamauchi

[11] Patent Number: 5,801,451
[45] Date of Patent: Sep. 1, 1998

[54] SEMICONDUCTOR DEVICE INCLUDING A PLURALITY OF INPUT BUFFER CIRCUITS RECEIVING THE SAME CONTROL SIGNAL

[75] Inventor: Tadaaki Yamauchi, Hyogo, Japan

[73] Assignee: Mitsubishi Denki Kabushiki Kaisha, Tokyo, Japan

[21] Appl. No.: 978,972

[22] Filed: Nov. 26, 1997

Related U.S. Application Data

[63] Continuation of Ser. No. 589,513, Jan. 22, 1996, abandoned.

[30] Foreign Application Priority Data

Feb. 14, 1995 [JP] Japan ................... 7-025340

[51] Int. Cl.$^6$ .......................... H01L 23/48; H01L 23/52; H01L 29/40
[52] U.S. Cl. ...................... 257/786; 257/784; 257/691; 257/692
[58] Field of Search ........................ 257/691, 692, 257/784, 786

[56] References Cited

U.S. PATENT DOCUMENTS

| | | | |
|---|---|---|---|
| 4,974,053 | 11/1990 | Kinoshita et al. | 257/786 |
| 5,229,846 | 7/1993 | Kozuka | 257/678 |
| 5,321,654 | 6/1994 | Miyamoto et al. | 365/194 |
| 5,391,918 | 2/1995 | Koyanagi et al. | 257/691 |
| 5,473,198 | 12/1995 | Hagiya et al. | 257/676 |

FOREIGN PATENT DOCUMENTS

| | | |
|---|---|---|
| 59-63744 | 4/1984 | Japan . |
| 59-144157 | 8/1984 | Japan . |
| 60-35544 | 2/1985 | Japan . |
| 60-103631 | 6/1985 | Japan . |
| 63-52458 | 3/1988 | Japan . |
| 63-200554 | 8/1988 | Japan . |
| 3-214669 | 9/1991 | Japan . |
| 3-263334 | 11/1991 | Japan . |

*Primary Examiner*—Teresa Maria Arroyo
*Attorney, Agent, or Firm*—McDermott, Will & Emery

[57] ABSTRACT

A control signal applied to a lead terminal is transmitted to metal wires and bonding pads. The control signal arriving at the bonding pads are provided at high speed from the lead terminal to the input nodes of input buffer circuits via interconnection layers with almost no difference in the signal transmission time delay. The input buffer circuits can be disposed in close proximity to a desired circuit controlled by the same control signal and also in close proximity to any of the bonding pads. The length of the interconnection layers for connecting an input node of an input buffer circuit with a corresponding bonding pad can be reduced, so that the difference in the signal transmission time delay can be neglected. Thus, a high speed semiconductor device is provided that can have the signal delay difference of a control signal applied to the input buffers reduced.

31 Claims, 21 Drawing Sheets

SEMICONDUCTOR DEVICE INCLUDING A PLURALITY OF INPUT BUFFER CIRCUITS RECEIVING THE SAME CONTROL SIGNAL

This application is a continuation of application Ser. No. 08/589,513 filed Jan. 22, 1996, now abandoned.

BACKGROUND OF THE INVENTION

1. Field of the Invention

The present invention relates to a semiconductor device including a plurality of input buffer circuits receiving the same one control signal at respective input nodes. More particularly, the present invention relates to a path for providing the same control signal to input nodes of a plurality of input buffer circuits.

2. Description of the Background Art

A conventional semiconductor device is described in Japanese Patent Laying-Open No. 3-214669 and in particular, FIGS. 22 and 24 thereof or Japanese Patent Laying-Open No. 63-200554 and in particular, FIGS. 1 and 2 thereof.

In such a semiconductor device, one lead terminal for ground potential (and a lead terminal for power supply voltage) for reducing the noise level of a ground line (and a power supply line) in a semiconductor chip is connected with respect to a plurality of bonding pads for ground potential (and a plurality of bonding pads for power supply voltage) formed on the semiconductor chip. The plurality of ground potential bonding pads (and the plurality of power supply voltage bonding pads) are electrically connected to one ground potential lead terminal (and power supply voltage lead terminal) via a plurality of metal wires. A lead terminal receives a control signal such as a clock signal or an address signal. Each lead terminal is accorded one type of signal. One bonding pad is provided in the semiconductor chip corresponding to each lead terminal. A lead terminal and a corresponding bonding pad are electrically connected by a metal wire.

Japanese Patent Laying-Open No. 59-63744 discloses a structure in which an input bonding pad and an output bonding pad are provided in close proximity with respect to one input/output lead terminal in FIG. 2. The input/output lead terminal is electrically connected to the input bonding pad and the output bonding pad respectively via metal wires.

Various semiconductor devices directed to increase the integration density, function, and speed are developed including a plurality of circuits controlled by the same control signal on a semiconductor chip. For example, a DRAM including a plurality of memory cell arrays controlled according to the same control signal for every memory cell array and a synchronous DRAM controlled in synchronization with a clock signal (control signal) serving as a synchronizing signal are proposed.

Such a semiconductor device including a plurality of circuits on a semiconductor chip controlled by the same one control signal has a problem set forth in the following. When a control signal received at one bonding pad via one lead terminal and one metal wire is provided to the plurality of circuits therein via respective interconnection layers, there is a difference in the signal propagation time period between a circuit located in the proximity of that bonding pad and a circuit provided most remote from that bonding pad due to the leading arrangement of the interconnections layers. The operation rate of the semiconductor device is limited to that of the interconnection layer of the longest signal path. It was difficult to improve the speed of a semiconductor device.

SUMMARY OF THE INVENTION

In view of the foregoing, an object of the present invention is to provide a semiconductor device including a plurality of input buffer circuits receiving the same control signal in which difference in signal delay of an input control signal with respect to each input buffer circuit is reduced significantly.

A semiconductor device according to a first aspect of the present invention has a semiconductor chip provided including a plurality of bonding pads to which the same control signal is applied, a plurality of input buffer circuits provided corresponding to the plurality of bonding pads, and a plurality of interconnections layers, each electrically connecting an input node of a corresponding input buffer circuit with a corresponding bonding pad. A lead terminal receiving the control signal is provided corresponding to the plurality of bonding pads. A corresponding bonding pad and a lead terminal are electrically connected by a metal wire. A plurality of bonding pads receiving the same control signal are disposed in close proximity to respective corresponding input buffer circuits. Difference in delay of the control signal to each bonding pad is minimized. As a result, a desired circuit in the semiconductor chip controlled by the same control signal can be controlled with almost no difference in delay. Thus, a high speed semiconductor device can be obtained.

A semiconductor device according to a second aspect of the present invention has a semiconductor chip provided including a plurality of bonding pads to which the same control signal is applied, a plurality of input buffer circuits provided corresponding to the plurality of bonding pads, a plurality of interconnection layers, each electrically connecting an input node of respective corresponding input buffer circuits with a corresponding bonding pad, and an output side interconnection layer of a metal layer for electrically connecting output nodes of the plurality of input buffer circuits. A lead terminal receiving the control signal is provided with respect to the plurality of bonding pads. Each corresponding bonding pad is electrically connected with a corresponding lead terminal by a metal wire. Therefore, a plurality of bonding pads to which the same control signal is applied can be disposed in close proximity to respective corresponding input buffer circuits. Furthermore, difference in delay of the control signal to each bonding pad can be minimized. The output side interconnection layer formed of a metal layer serves to minimize difference in delay of output from the output node of each input buffer circuit. As a result, a desired circuit in a semiconductor chip controlled by the same control signal can be controlled with almost no difference in signal delay. Thus, a semiconductor device of high speed can be obtained.

A semiconductor device according to a third aspect of the present invention is provided with a semiconductor chip including a plurality of bonding pad groups having a plurality of bonding pads to which the same control signal is applied, a plurality of input buffer circuits provided corresponding to the plurality of bonding pad groups and formed on the surface of a semiconductor substrate, each for receiving the control signal at an input node and providing a signal according to the control signal to an output node, and a plurality of interconnection layers of a metal layer corresponding to the plurality of bonding pad groups, and formed on an insulating layer on the surface of the semiconductor substrate, each interconnection layer electrically connecting the plurality of bonding pads of a corresponding bonding group with an input node of a corresponding input buffer circuit.

The semiconductor device of the third aspect further includes a lead terminal provided corresponding to the plurality of bonding pad groups for receiving the control signal, and a plurality of metal wires corresponding to the plurality of bonding pads for electrically connecting a bonding pad and a corresponding lead terminal.

As a result, a plurality of bonding pads to which the same control signal is applied can be disposed in close proximity to respective corresponding input buffers. Furthermore, difference in signal delay of the control signal to each bonding pad is minimized. As a result, a desired circuit in a semiconductor chip controlled by the same control signal can be controlled with almost no difference in signal delay. Thus, a high speed semiconductor device is obtained.

A semiconductor device according to a fourth embodiment of the present invention is provided with a semiconductor chip including a plurality of bonding pad groups formed on an insulating layer on a surface of a semiconductor substrate, and having a plurality of bonding pads to which the same control signal is applied, a plurality of input buffer circuits corresponding to the plurality of bonding pads in the plurality of bonding pad groups and formed on the surface of the semiconductor substrate, each for receiving the control signal at an input node and providing a signal according to the control signal to an output node, and a plurality of interconnections layers of a metal layer corresponding to the plurality of input buffer circuits, and formed on the insulating layer on the surface of the semiconductor substrate for electrically connecting an input node of a corresponding input buffer circuit with a corresponding bonding pad. The semiconductor device of the fourth aspect further includes a plurality of lead terminals corresponding to the plurality of bonding pad groups, each receiving the control signal, and a plurality of metal wire groups provided corresponding to the plurality of bonding pad groups, and each group including a plurality of metal wires, each metal wire electrically connecting a corresponding bonding pad of a corresponding bonding group with a corresponding lead terminal.

Therefore, a plurality of bonding pad groups including a plurality of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. Thus, a semiconductor device of high speed can be obtained. The semiconductor device has the advantage of arranging with high margin the metal wires connecting a lead terminal and a corresponding bonding pad.

A semiconductor device according to a fifth aspect of the present invention is provided with a semiconductor chip including a plurality of bonding pad groups formed on an insulating layer on a surface of a semiconductor substrate, and having a plurality of bonding pads to which the same control signal is applied, a plurality of input buffer circuits corresponding to the plurality of bonding pad groups, and formed on the surface of the semiconductor substrate, each for receiving the control signal at an input node and providing a signal according to the control signal at an output node, and a plurality of interconnection layers of a metal layer, corresponding to the plurality of bonding pad groups, and formed on the insulating layer on the surface of the semiconductor substrate, each interconnection layer electrically connecting a plurality of bonding pads of a corresponding bonding pad group with an input node of a corresponding input buffer circuit.

The semiconductor device of the fifth aspect further includes a plurality of lead terminals corresponding to the plurality of bonding pad groups, each receiving a control signal, and a plurality metal wire groups provided corresponding to the plurality of bonding pad groups, and each group including a plurality of metal wires, each metal wire electrically connecting a bonding pad of a corresponding bonding pad group with a corresponding lead terminal.

Therefore, a plurality of bonding pad groups including a plurality of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. Thus, a semiconductor device of high speed can be obtained. Furthermore, the semiconductor device has the advantage of arranging with high margin the metal wires connecting a lead terminal and a corresponding bonding pad.

A semiconductor device according to a sixth aspect of the present invention has a semiconductor chip provided including a plurality of bonding pads to which the same control signal is applied, a plurality of input buffer circuits corresponding to the plurality of bonding pads, and a plurality of interconnection layers, each interconnection layer electrically connecting an input node of a corresponding input buffer circuit with a corresponding bonding pad. A lead terminal receiving the control signal is provided corresponding to the plurality of bonding pads, and includes a lead segment receiving an external control signal at one end, and a connection segment provided integral with the other end of the lead segment, and parallel to the longer side of the semiconductor substrate. The semiconductor device has a corresponding bonding pad connected to a lead terminal via respective metal wires.

Therefore, a plurality of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. A semiconductor device of high speed can be obtained. The semiconductor device has the advantage of arranging with high margin the metal wires connecting a lead segment and a connection segment of a lead terminal with a corresponding bonding pad.

A semiconductor device according to a seventh aspect of the present invention has a semiconductor chip provided including a plurality of bonding pad groups formed on an insulating layer on a surface of a semiconductor substrate, and having a plurality of bonding pads to which the same control signal is applied, a plurality of input buffer circuits corresponding to the plurality of bonding pad groups, and formed on the surface of the semiconductor substrate, each for receiving the control signal at an input node and providing a signal according to the control signal to an output node, and a plurality of interconnection layers of a metal layer corresponding to the plurality of bonding pad groups, and formed on the insulating layer on the surface of the semiconductor substrate, each interconnection layer electrically connecting a plurality of bonding pads of the corresponding bonding pad group with an input node of a corresponding input buffer circuit. The semiconductor device of the seventh aspect further includes a lead terminal having a lead segment provided corresponding to the plurality of bonding pads of the plurality of bonding pad groups, and receiving an external control signal at one end, and a connection segment formed integral with the other end of the lead segment, and parallel to the longer side of the semiconductor substrate, and a plurality of metal wires provided corresponding to the plurality of bonding pads of the plurality of bonding pad groups, each metal wire electrically connecting a corresponding bonding pad with a corresponding lead terminal.

Therefore, a plurality of bonding pad groups including a plurality of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. Thus, a semiconductor device of high speed can be obtained. The semiconductor device further has the advantage of arranging with high margin the metal wires connecting a lead segment and a connection segment of a lead terminal with a corresponding bonding pad.

A semiconductor device according to an eighth aspect of the present invention is provided with a semiconductor chip including a plurality of bonding pads of a right side row and a left side row of bonding pads along a central line of the semiconductor substrate parallel to the longer side thereof, wherein the same control signal is applied to a predetermined number of bonding pads of the right side row and a predetermined number of bonding pads of the left side row, a plurality of input buffer circuits provided corresponding to the predetermined number of bonding pads of the right side row and the predetermined number of bonding pads of the left side row, and a plurality of interconnection layers, each electrically connecting an input node of a corresponding input buffer circuit with a corresponding bonding pad. The semiconductor device includes a lead terminal receiving the control signal and provided corresponding to the predetermined number of bonding pads of the right side row and the left side row. The lead terminal includes a lead segment for receiving an external control signal at one end, and a connection segment formed integral with the other end of the lead segment, and located parallel to the longer side of the semiconductor substrate and between the right side row and the left side row of the plurality of bonding pads. A corresponding bonding pad is electrically connected with a lead terminal by a metal wire.

Therefore, a predetermined number of right side row and left side row of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. Thus, a semiconductor device of high speed can be obtained. The semiconductor device further has the advantage of arranging with high margin the metal wires connecting a lead segment and a connection segment of a lead terminal with a corresponding bonding pad.

A semiconductor device according to a ninth aspect of the present invention is provided with a semiconductor chip including a plurality of bonding pads arranged along a central line parallel to the shorter side of a semiconductor substrate, each receiving the same control signal, a plurality of input buffer circuits provided corresponding to the plurality of bonding pads, and a plurality of interconnection layers of a metal layer, each electrically connecting an input node of a corresponding input buffer circuit with a corresponding bonding pad. A lead terminal receiving the control signal is provided corresponding to the plurality of bonding pads. A corresponding bonding pad is electrically connected to a corresponding lead terminal by a metal wire.

Therefore, a plurality of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. Thus, a semiconductor device of high speed can be obtained.

A semiconductor device according to a tenth embodiment of the present invention is provided with a semiconductor chip including a rectangular semiconductor substrate having long sides and short sides, a plurality of bonding pads formed on an insulating layer on the surface of the semiconductor substrate, having a long side row of bonding pads and a short side row of bonding pads arranged along a center line parallel to the longer side of the semiconductor substrate and a center line parallel to the shorter side of the semiconductor substrate, wherein the same control signal is applied to a predetermined number of bonding pads of the long side row and a predetermined number of bonding pads of the short side row, a plurality of input buffer circuits provided corresponding to the predetermined number of bonding pads of the long side row and the short side row, and formed on the surface of the semiconductor substrate, each for receiving the control signal at an input node and providing a signal according to the control signal to the output node, and a plurality of interconnection layers corresponding to the plurality of input buffer circuits, and formed on an insulating layer on the surface of the semiconductor substrate, each electrically connecting an input node of a corresponding input buffer circuit and a corresponding bonding pad. The semiconductor device further includes a lead terminal provided corresponding to the predetermined number of bonding pads of the long side row and short side row for receiving the control signal, and a plurality of metal wires corresponding to the predetermined number of bonding pads of the long side row and the short side row, each electrically connecting a corresponding bonding pad with a corresponding lead terminal.

Therefore, a predetermined number of bonding pads of the long side row and the short side row to which the same control signal is applied can be disposed in close proximity to respective corresponding input buffer circuits. Furthermore, difference in delay of the control signal to each bonding pad is minimized. As a result, a desired circuit in a semiconductor chip con troll ed by the same control signal can be controlled with almost no difference in signal delay. Thus, a semiconductor device of high speed can be obtained.

A semiconductor device according to an eleventh aspect of the present invention is provided with a semiconductor chip including a plurality of bonding pads provided at the four corners of a semiconductor substrate, each bonding pad receiving the same control signal, a plurality of input buffer circuits provided corresponding to the plurality of bonding pads, and a plurality of interconnection layers of a metal layer, each electrically connecting an input node of a corresponding input buffer circuit with a corresponding bonding pad. The semiconductor device includes a lead terminal receiving the control signal and provided corresponding to the plurality of bonding pads. The lead terminal includes a lead segment having a first section and a second section in close proximity to the pair of short sides of the semiconductor substrate, and a connection segment formed integral with the lead segment and located between the other ends of the first and second sections. A corresponding bonding pad is electrically connected to a lead terminal via a metal wire. Therefore, a plurality of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. Thus, a semiconductor device of high speed can be obtained. The semiconductor device further has the advantage of arranging with high margin the metal wires connecting a lead segment and a connection segment of a lead terminal with a corresponding bonding pad.

A semiconductor device according to a twelfth embodiment of the present invention is provided with a first semiconductor chip and a second semiconductor chip, including first and second bonding pads receiving the same control signal and formed on first and second semiconductor substrates, respectively, first and second input buffer circuits provided corresponding to the first and second bonding pads, respectively, a first interconnection for electrically connecting an input node of the first input buffer circuit with the first bonding pad, and a second interconnection for electrically connecting an input node of the second input buffer circuit with the second bonding pad. A lead terminal receiving a control signal is provided corresponding to the first and second bonding pads. The first bonding pad is electrically connected to the lead terminal by the first metal wire. The second bonding pad is electrically connected to a lead terminal by a second metal wire.

Therefore, first and second bonding pads to which the same control signal is applied can be disposed in close proximity to respective corresponding input buffer circuits. Furthermore, difference in delay of the control signal to each bonding pad is minimized. As a result, the first and second semiconductor chips controlled by the same control signal can be controlled with almost no difference in signal delay. Thus, a semiconductor device of high speed can be obtained.

A semiconductor device according to a thirteenth embodiment of the present invention has a semiconductor chip provided including a plurality of bonding pads formed on an insulating layer on the surface of a semiconductor substrate and along the edge of the semiconductor substrate, each receiving the same control signal, a plurality of input buffer circuits formed corresponding to the plurality of bonding pads and at the surface of the semiconductor substrate, each for receiving the control signal at an input node and providing a signal according to the control signal to an output node, and a plurality of interconnection layers of a metal layer formed corresponding to the plurality of input buffer circuits and on the insulating layer on the surface of the semiconductor substrate, each electrically connecting an input node of a corresponding input buffer circuit with a corresponding bonding pad. The semiconductor device further includes a lead terminal unit provided corresponding to the plurality of bonding pads for receiving the control signal, and a plurality of metal wires provided corresponding to the plurality of bonding pads, each electrically connecting a corresponding bonding pad with the lead terminal unit.

Therefore, a plurality of bonding pads to which the same control signal is applied can be disposed in close proximity to respective corresponding input buffer circuits. Furthermore, difference in delay of the control signal to each bonding pad is minimized. As a result, a desired circuit in a semiconductor chip controlled by the same control signal can be controlled with almost no difference in signal delay. Thus, a semiconductor device of high speed can be obtained.

The foregoing and other objects, features, aspects and advantages of the present invention will become more apparent from the following detailed description of the present invention when taken in conjunction with they accompanying drawings.

DESCRIPTION OF THE PREFERRED EMBODIMENTS

FIRST EMBODIMENT

Figure 1:
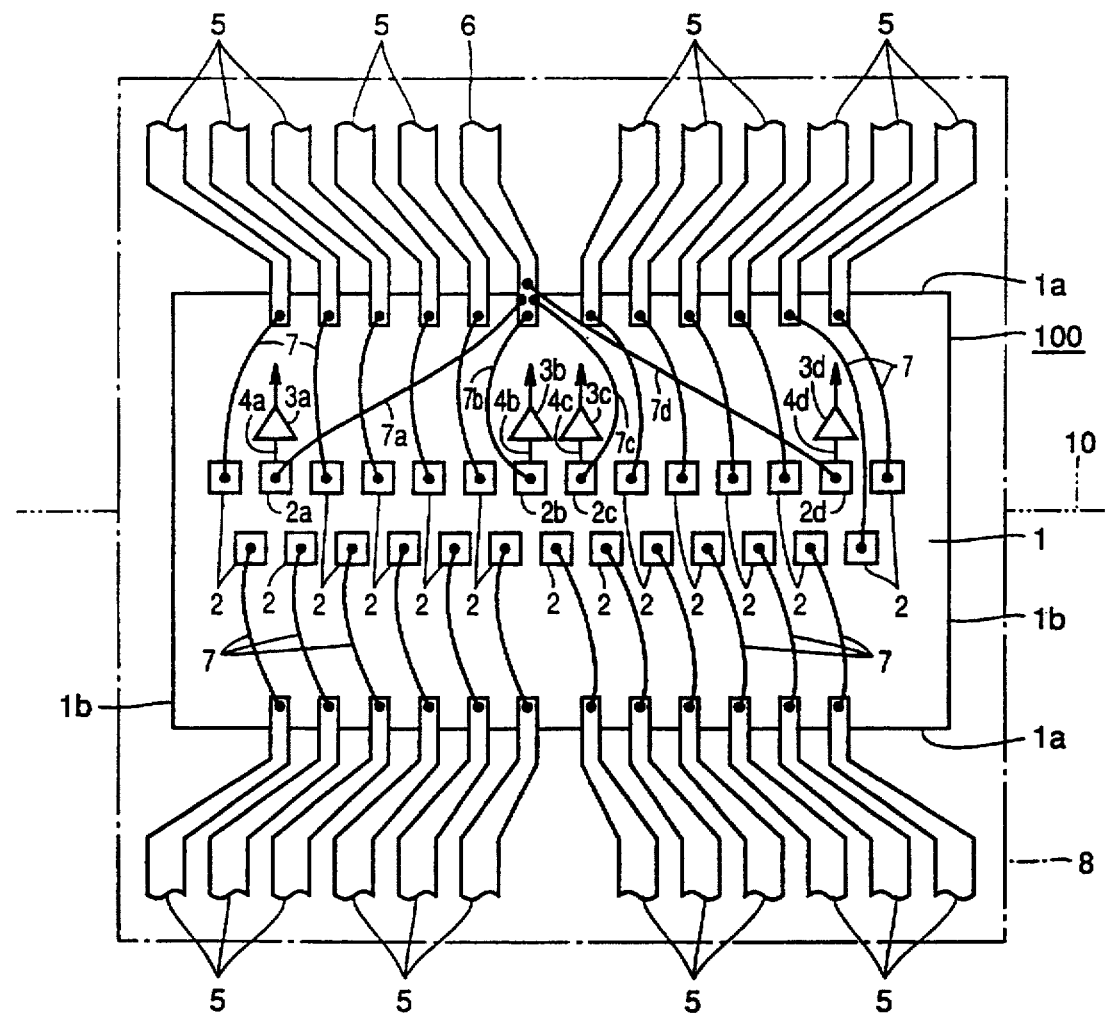
FIG. 1 is a plan view schematically showing a semiconductor device according to a first embodiment of the present invention.

Referring to FIG. 1, a semiconductor device according to a first embodiment of the present invention includes a rectangular semiconductor substrate 1 defined by a long side 1a and a short side 1b, and a right side row and a left side row of a plurality of bonding pads 2 disposed along a center line 10 parallel to long side 1a of semiconductor substrate 1, and formed on an insulating layer (not shown) on the surface of semiconductor substrate 1. The plurality of bonding pads are formed of a metal such as aluminum. In the first embodiment, the same control signal, for example, a clock signal (a synchronizing signal in a synchronous DRAM) is applied to four bonding pads 2a–2d out of the plurality of bonding pads. Bonding pads 2a and 2d are located in the proximity of respective short sides 1b. Bonding pads 2b and 2c are located at the proximity of the center of semiconductor substrate 1. Bonding pads 2 receiving another control signal (for example, an address signal) or data and for data output are provided between bonding pads 2a and 2b, and also between bonding pads 2c and 2d. In some cases, bonding pads for ground or power supply are provided between bonding pads 2a and 2b, and 2c and 2d.

Figure 2:
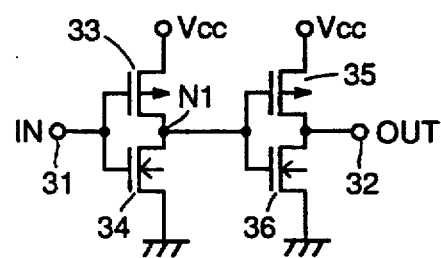
FIG. 2 is a circuit diagram of input buffer circuits 3a–3d according to the first embodiment of the present invention.

The semiconductor device of the first embodiment further includes a plurality of input buffer circuits 3a–3d corresponding to bonding pads 2a–2d receiving the same control signal, and formed at the surface of semiconductor substrate 1. As shown in FIG. 2, each input buffer circuit includes an input node 31 for receiving a predetermined control signal, an output node 32 formed in close proximity to a corresponding input buffer circuit at the surface of semiconductor substrate 1 for providing a signal according to the predetermined control signal to a desired circuit (not shown) that is controlled by the predetermined control signal, a P channel MOS transistor 33 between a power supply potential node Vcc and a node N1, having a gate electrode connected to input node 31, an N channel MOS transistors 34 between node N1 and a ground potential node, having a gate electrode connected to input node 31, and forming a first inverter circuit with P channel MOS transistor 33, a P channel MOS transistor 35 between power supply potential node Vcc and output node 32, and having a gate electrode connected to node N1, and an N channel MOS transistor 36 between output node 32 and the ground potential node, having a gate electrode connected to node N1, and forming a second inverter circuit with P channel MOS transistor 35.

The semiconductor device further includes a plurality of interconnections layers (input side interconnection layer) 4a–4d of a metal layer corresponding to input buffer circuits 3a–3d, respectively, and formed on an insulating layer (not shown) on the surface of semiconductor substrate 1. Each interconnection layer electrically connects input node 31 of a corresponding one of input buffers circuits 3a–3d with a corresponding one of bonding pads 2a–2d, respectively. An interconnection layer is formed of a metal layer such as of aluminum. A semiconductor chip 100 of the present semiconductor device includes the above-described plurality of bonding pads 2, 2a–2d, plurality of input buffer circuits 3a–3d, and plurality of interconnections layers 4a–4d.

The semiconductor device further includes lead terminals 5 and 6. A plurality of lead terminals 5 are provided in a one-to-one correspondence with the plurality of bonding pads 2, and is formed of an alloy such as iron and aluminum having high conductivity. The lead terminals serve to receive an external control signal, for example, an address signal, and data, to provide data to the outside world, to be set to ground potential, and to be applied with a power supply potential. Lead terminal 6 is provided corresponding to bonding pads 2a–2d having an external control signal such as a clock signal supplied at one end. Lead terminals 5 and 6 are formed of an alloy such as iron and aluminum of high conductivity.

The semiconductor device further includes a plurality of metal wires 7 of high conductivity formed of an alloy such as iron and aluminum, provided in a one-to-one correspondence with the plurality of lead terminals 5. Each metal wire electrically connects a corresponding bonding pad 2 with a corresponding lead terminal 5. A plurality of metal wires 7a–7d out of metal wires 7 are provided in a one-to-one correspondence with bonding pads 2a–2d, each electrically connecting a corresponding one of bonding pads 2a–2d with lead terminal 6.

Semiconductor chip 100, lead terminals 5 and 6, metal wires 7, 7a–7d are accommodated in a package 8 by resin molding.

Figure 3:
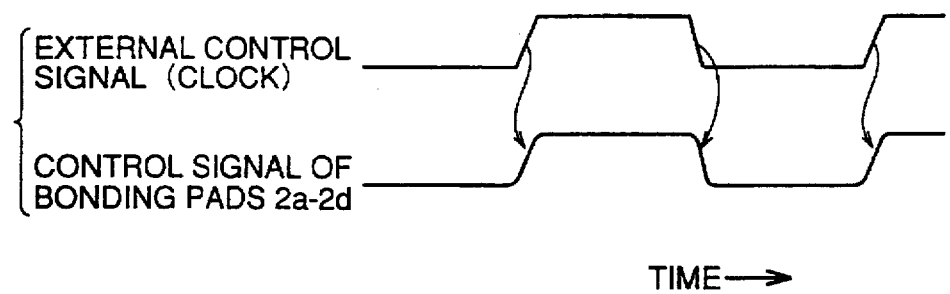
FIG. 3 is a waveform diagram showing a control signal according to the first embodiment of the present invention.

In the semiconductor device of the above-described structure, a control signal such as a clock signal (the external control signal in FIG. 3) for controlling semiconductor chip 100, more specifically, a desired circuit controlled by an output of input buffer circuits 3a–3d formed in semiconductor chip 100, is applied to lead terminal 6. This control signal is transmitted through respective paths of lead terminal 6→metal wire 7a→bonding pad 2a; lead terminal 6→metal wire 7b→bonding pad 2b; lead terminal 6→metal wire 7c→bonding pad 2c; and lead terminal 6→metal wire 7d→bonding pad 2d. A control signal received at lead terminal 6 is transmitted at high speed to respective bonding pads 2a–2d since lead terminal 6 and metal wires 7a–7d are formed of an alloy of high conductivity. Although there is a slight difference in length in metal wires 7a–7d, there is almost no difference in the delay of the signal transmission time in the control signals arriving at respective bonding pads 2a–2d.

The control signal at respective bonding pads 2a–2d is applied to input node 31 of input buffer circuits 3a–3d, respectively, via interconnection layers 4a–4d. By virtue of the location of bonding pads 2a–2d, input buffer circuits 3a–3d can be disposed in proximity to a desired circuit and in proximity to any of bonding pads 2a–2d regardless of the location of the desired circuit controlled by the predetermined control signal on semiconductor substrate 1. As a result, interconnection layers 4a–4d connecting input node 31 of input buffer circuits 3a–3d and bonding pads 2a–2d, respectively, can be reduced in length. The difference in the length thereof is so small that the delay difference in the signal transmission time can be neglected.

Thus, a control signal applied via lead terminal 6 is applied to input node 31 of input buffer circuits 3a–3d with no difference delay in the signal transmission time. Semiconductor chip 100 can entirely be controlled at high speed.

The present invention is not limited to the first embodiment where there are four desired circuits to be controlled by a predetermined control signal, four input buffer circuits 3a–3d, four bonding pads 2a–2d, and four metal wires 7a–7d. An arbitrary number of these components may be provided as long as they are plural in number.

SECOND EMBODIMENT

Figure 4:
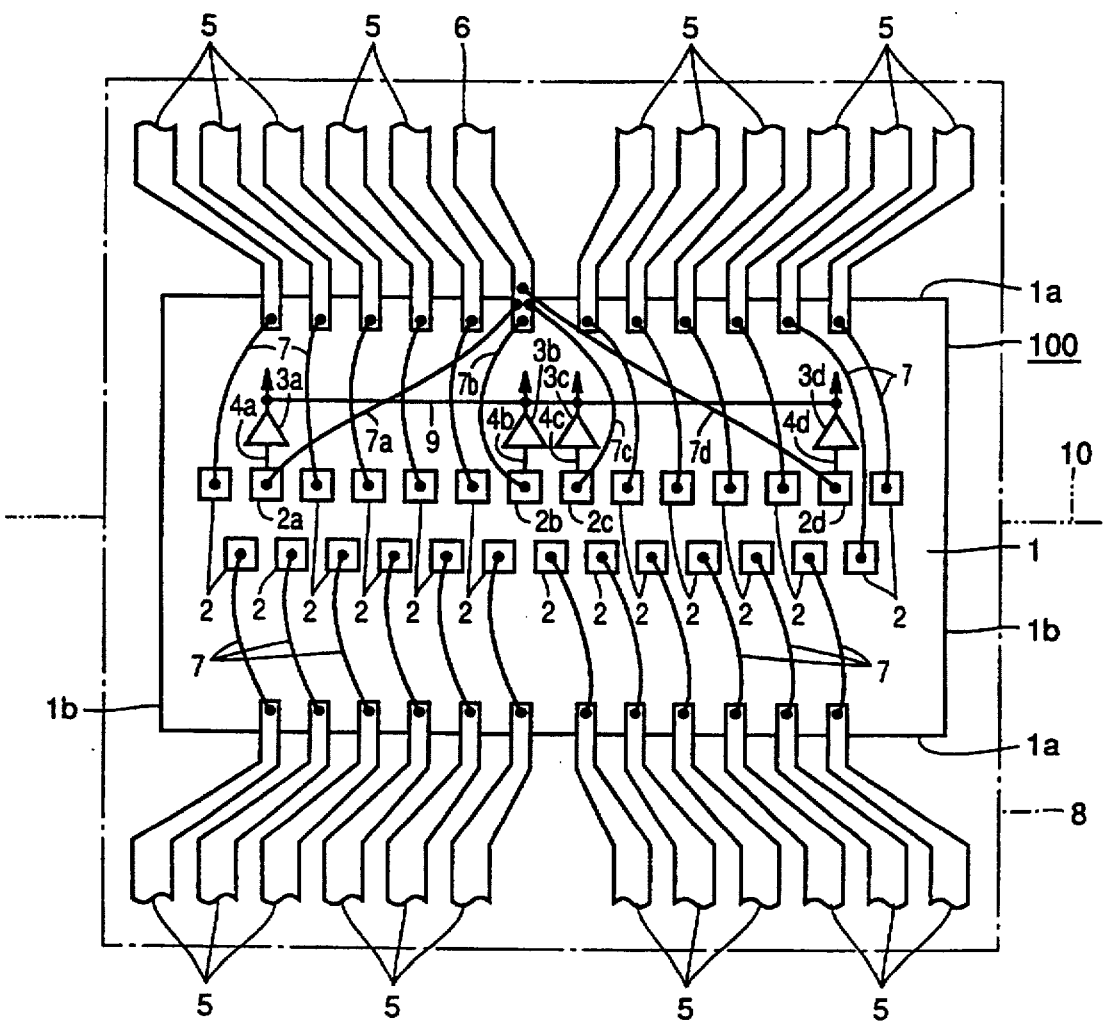
FIGS. 4–23 are plan views schematically showing a semiconductor device according to second to twenty-first embodiments, respectively, of the present invention.

The semiconductor device of the second embodiment shown in FIG. 4 differs from the semiconductor device of the first embodiment shown in FIG. 1 in that an output interconnection layer 9 of a metal layer is additionally provided on an insulating layer (not shown) on the surface of semiconductor substrate 1 for electrically connecting all output nodes 32 of input buffer circuits 3a–3d. The remaining elements are similar to those of the first embodiment, and corresponding components have the same reference characters allotted.

The semiconductor device of the second embodiment provides advantages similar to those of the first embodiment. Furthermore, since output interconnection layer 9 electrically connects all output nodes 32 of input buffer circuits 3a–3d, difference in the signal transmission time delay of a control signal arriving at output node 32 of input buffer circuits 3a–3d is suppressed. Thus, semiconductor chip 100 can be controlled at high speed.

THIRD EMBODIMENT

Figure 5:
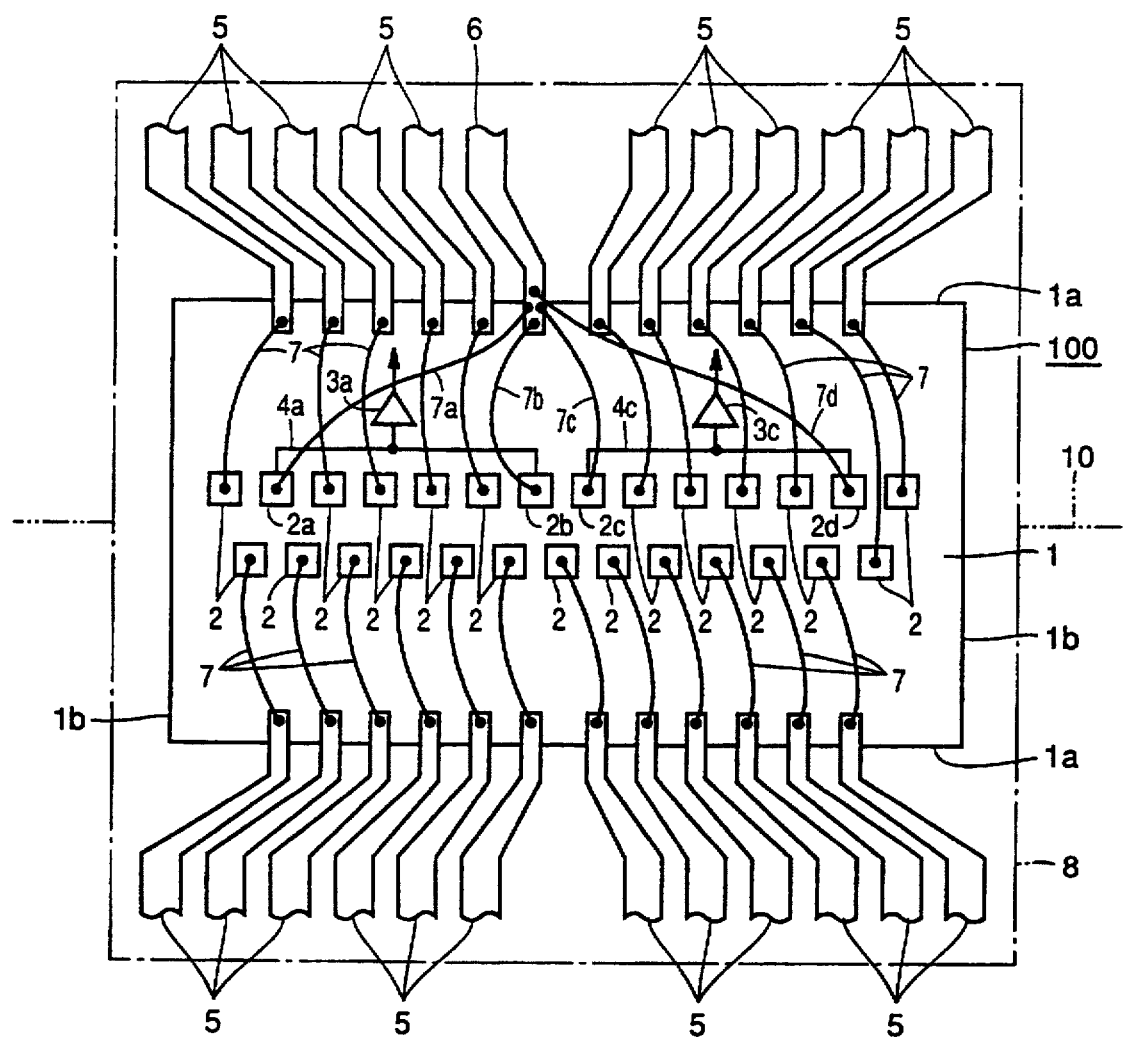

The semiconductor device of the third embodiment shown in FIG. 5 differs from the semiconductor device of the first embodiment shown in FIG. 1 in that input buffer circuit 3a is provided in common to two bonding pads 2a and 2b, and input buffer circuit 3c is provided in common to two bonding pads 2c and 2d. Furthermore, input node 31 of input buffer circuit 3a and two bonding pads 2a and 2b are electrically connected by interconnection layer 4a, and input node 31 of input buffer circuit 3c and two bonding pads 2c and 2d are electrically connected by interconnection layer 4c. The remaining elements are similar to those of the first embodiment.

In the present embodiment, the predetermined number of bonding pads 2a–2d receiving the same control signal (four in the third embodiment) is divided into a plurality of bonding pad groups (two in the third embodiment) with input buffer circuits 3a and 3c provided corresponding to respective bonding pad groups. Interconnection layer 4a electrically connects input buffer circuit 3a with bonding pads 2a and 2b of one corresponding bonding pad group. Interconnection layer 4c electrically connects input buffer circuit 3c with bonding pads 2c and 2d of another corresponding bonding pad group.

The semiconductor device of the third embodiment provides advantages similar to those of the first embodiment.

FOURTH EMBODIMENT

Figure 6:
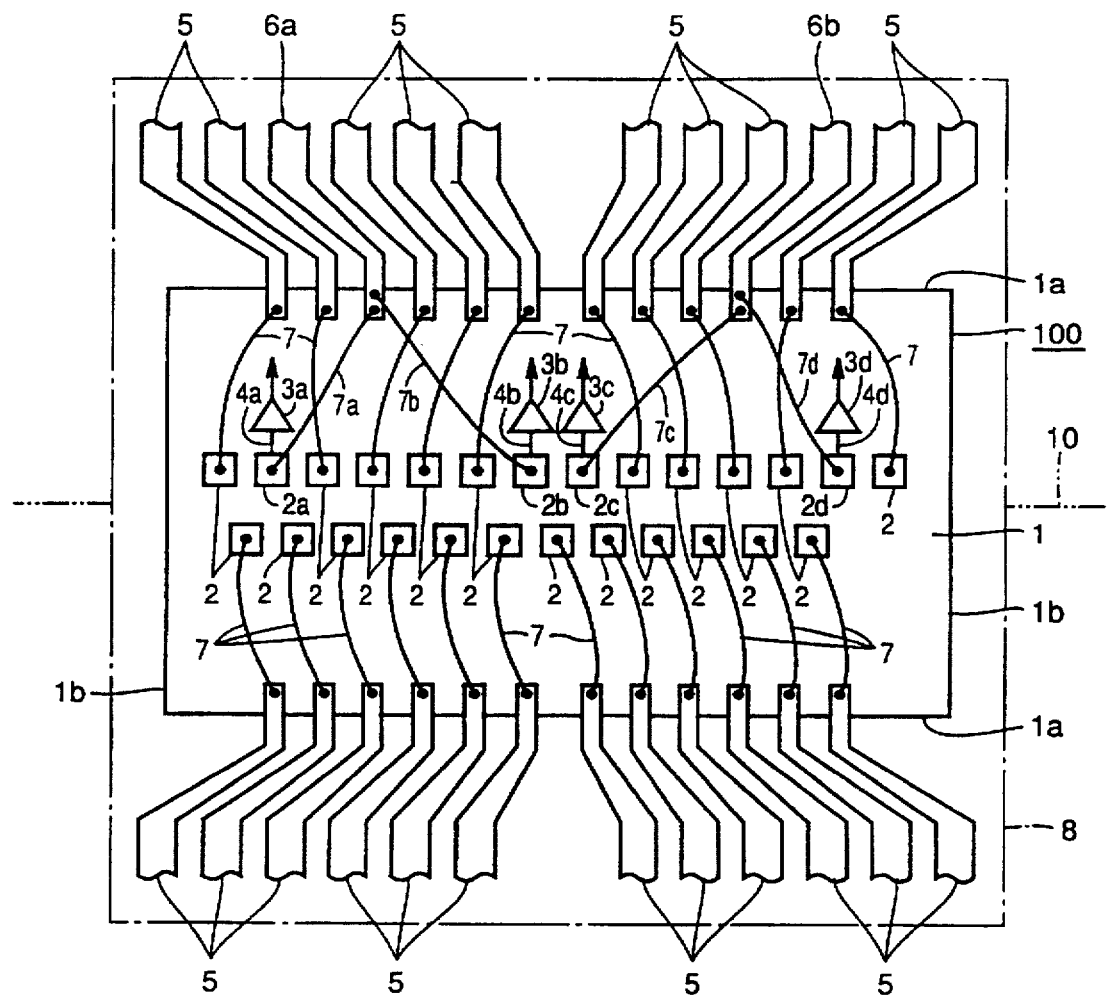

The semiconductor device according to a fourth embodiment of the present invention shown in FIG. 6 differs from the semiconductor device of the first embodiment shown in FIG. 1 having lead terminal 6 provided in common to four bonding pads 2a–2d in that a lead terminal 6a is provided in common to two bonding pads 2a and 2b, and a lead terminal 6b is provided in common to two bonding pads 2c and 2d. Furthermore, lead terminal 6a is electrically connected to bonding pads 2a and 2b via metal wires 7a and 7b. Lead terminal 6b is electrically connected to bonding pads 2c and 2d via metal wires 7c and 7d. The remaining elements are similar to those of the first embodiment.

In the present fourth embodiment, the respective bonding pads 2a–2d to which the same control signal is applied (four in the fourth embodiment) is divided into a plurality of bonding pad groups (two in the fourth embodiment). Lead terminals 6a and 6b are provided corresponding to respective bonding pad groups. Lead terminal 6a is electrically connected to bonding pads 2a and 2b of a corresponding bonding pad group via metal wires 7a and 7b forming one metal wire group. Lead terminal 6b is electrically connected to bonding pads 2c and 2d of a corresponding bonding pad group via metal wires 7c and 7d forming another metal wire group.

The semiconductor device of the fourth embodiment provides advantages similar to those of the first embodiment. Since the number of metal wires 7a–7d connected to lead terminals 6a–6b is reduced, connection thereof is facilitated. Furthermore, margin with respect to electrical shorting of another metal wire 7 is improved. More specifically, connection with margin to electrical shorting can be provided.

FIFTH EMBODIMENT

Figure 7:
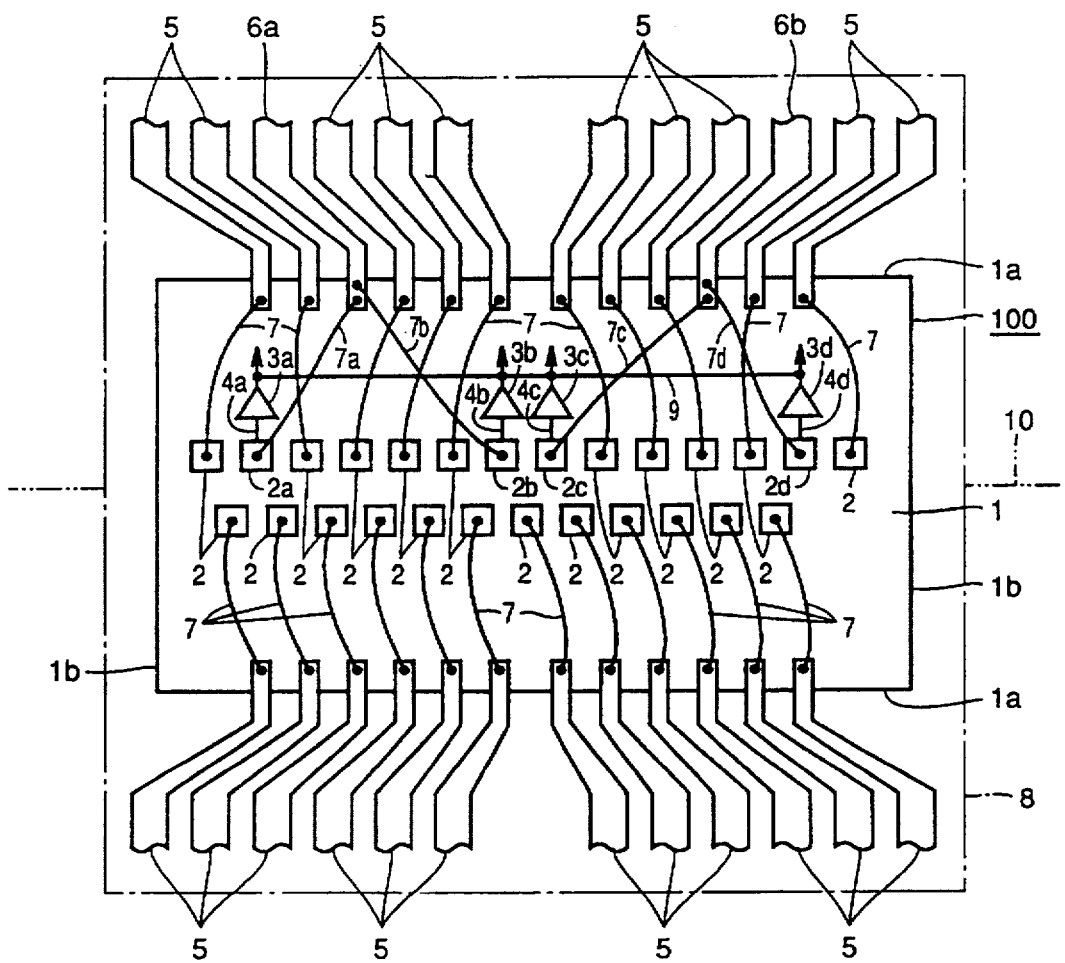

The semiconductor device according to a fifth embodiment of the present invention shown in FIG. 7 differs from the semiconductor device of the fourth embodiment shown in FIG. 6 in that an output interconnection layer 9 formed of a metal layer is additionally provided on an insulating layer (not shown) on the surface of semiconductor substrate 1 for electrically connecting all output nodes 32 of input buffer circuits 3a–3d. The remaining elements are similar to those of the fourth embodiment. Corresponding components have the same reference characters allotted.

The semiconductor device of the fifth embodiment provides advantages similar to those of the fourth embodiment. Since output interconnection layer 9 electrically connects all output nodes 32 of input buffer circuits 3a–3d, difference in the signal transmission time delay of a control signal arriving at output node 32 of input buffer circuit 3a–3d is suppressed. Semiconductor chip 100 can be controlled at higher speed.

SIXTH EMBODIMENT

Figure 8:
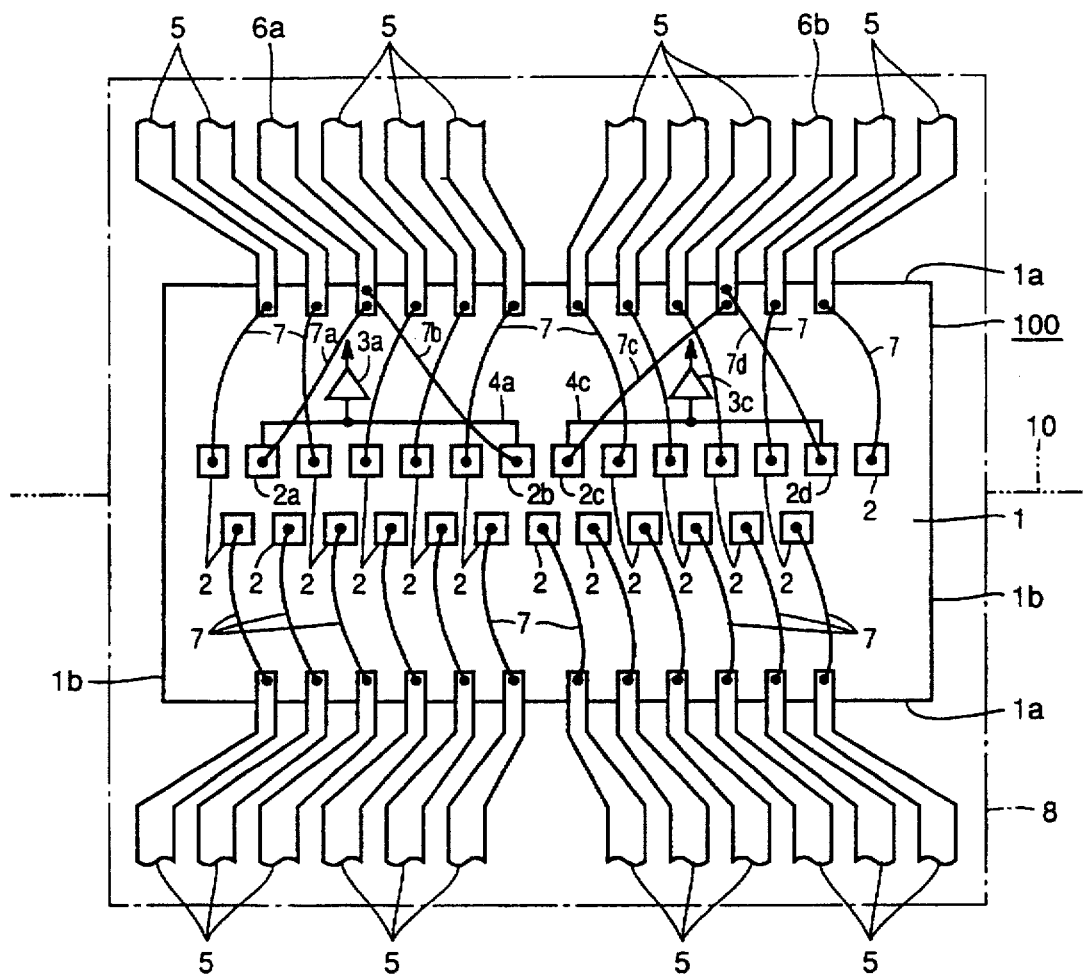

The semiconductor device according to a sixth embodiment of the present invention shown in FIG. 8 differs from the semiconductor device of the fourth embodiment shown in FIG. 6 in that input buffer circuit 3a is provided in common to two bonding pads 2a and 2b, and input buffer circuit 3c is provided in common to two bonding pads 2c and 2d. Input node 31 of input buffer circuit 3a is electrically connected to two bonding pads 2a and 2b by interconnection layer 4a. Input node 31 of input buffer circuit 3c is electrically connected to bonding pads 2c and 2d by interconnection layer 4c. The remaining elements are similar to those of the fourth embodiment.

In the semiconductor device of the sixth embodiment, the plurality of bonding pads 2a–2d receiving the same control signal (four in the sixth embodiment) are divided into a plurality of bonding pad groups (two in the sixth embodiment) with input buffer circuits 3a and 3c provided with respect to respective corresponding bonding pad groups. Interconnection layer 4a electrically connects input buffer circuit 3a with bonding pads 2a and 2b of a corresponding bonding pad group. Interconnection layer 4c electrically connects input buffer circuit 3c with bonding pads 2c and 2d of another corresponding bonding pad group.

Components in FIG. 8 corresponding to the components in FIG. 6 have the same reference characters allotted.

The semiconductor device of the sixth embodiment provides advantages similar to those of the fourth embodiment.

SEVENTH EMBODIMENT

Figure 9:
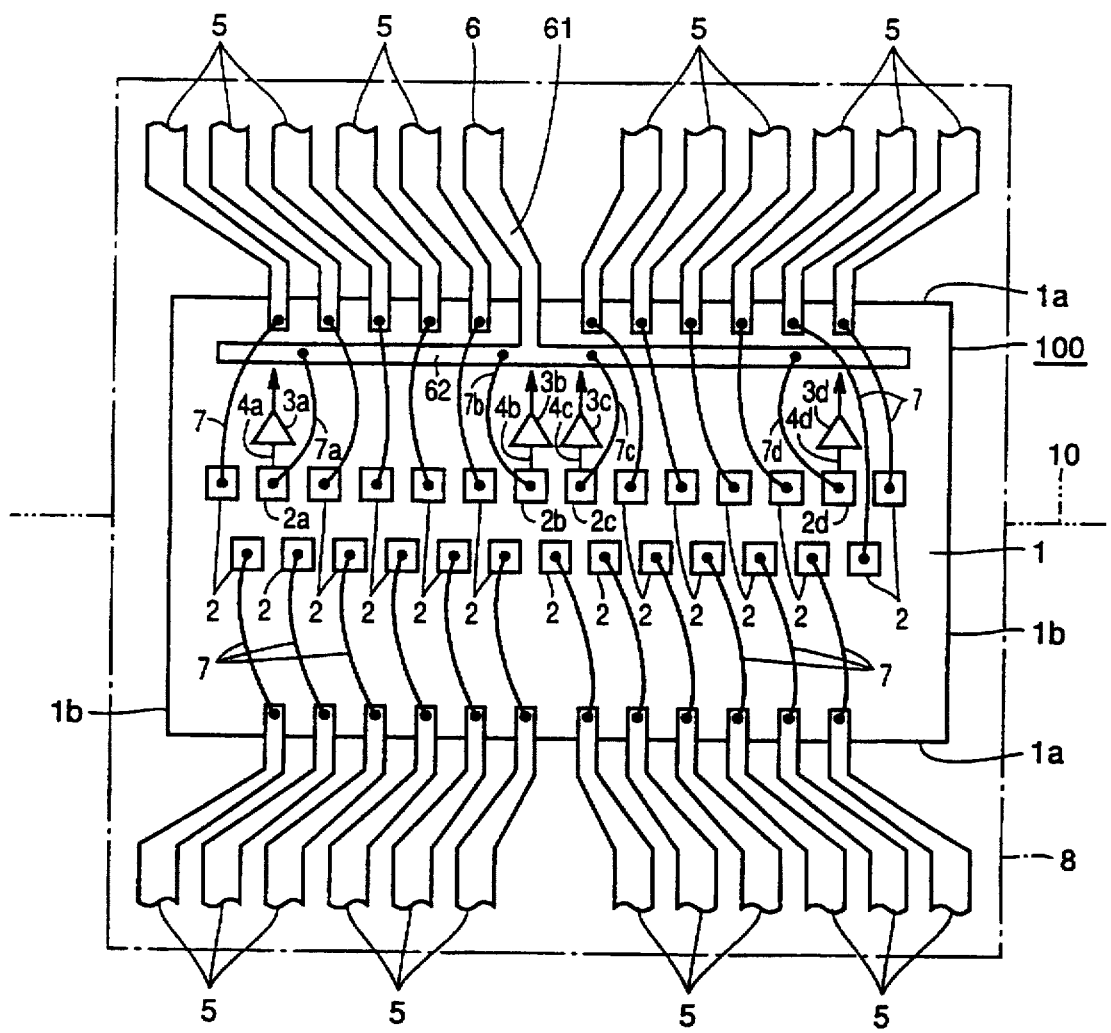

The semiconductor device according to a seventh embodiment of the present invention shown in FIG. 9 differs from the semiconductor device of the first embodiment shown in FIG. 1 in that lead terminal 6 includes a lead segment 61 receiving an external control signal at one end, and a connection segment 62 formed integrally with the other end of lead segment 61, and having a length substantially equal to (slightly shorter) and in parallel with long side 1a of semiconductor substrate 1 above the surface of semiconductor substrate 1. Connection segment 62 of lead terminal 6 is electrically connected to bonding pads 2a–2d via metal wires 7a–7d. The remaining elements are similar to those of the first embodiment. Components of the FIG. 9 corresponding to those of FIG. 1 have the same reference characters allotted.

The semiconductor device of the seventh embodiment provides advantages similar to those of the fourth embodiment. Since metal wires 7a–7d are connected by connection segment 62 having a length parallel to and substantially identical to long side 1a of semiconductor substrate 1, metal wires 7, 7a–7d can be disposed with no crossing therebetween. The connection thereof is facilitated, and the margin with respect to electrical shorting between metal wires 7, 7a–7d is improved. Therefore, connection with margin with respect to electrical shorting can be provided.

Although the length of connection segment 62 of lead terminal 6 is set substantially equal to the length of long side 1a of semiconductor substrate 1 in the seventh embodiment, a similar effect can be provided as long as the length of connection segment 62 is at least ½ the length of long side 1a of semiconductor substrate 1.

EIGHTH EMBODIMENT

Figure 10:
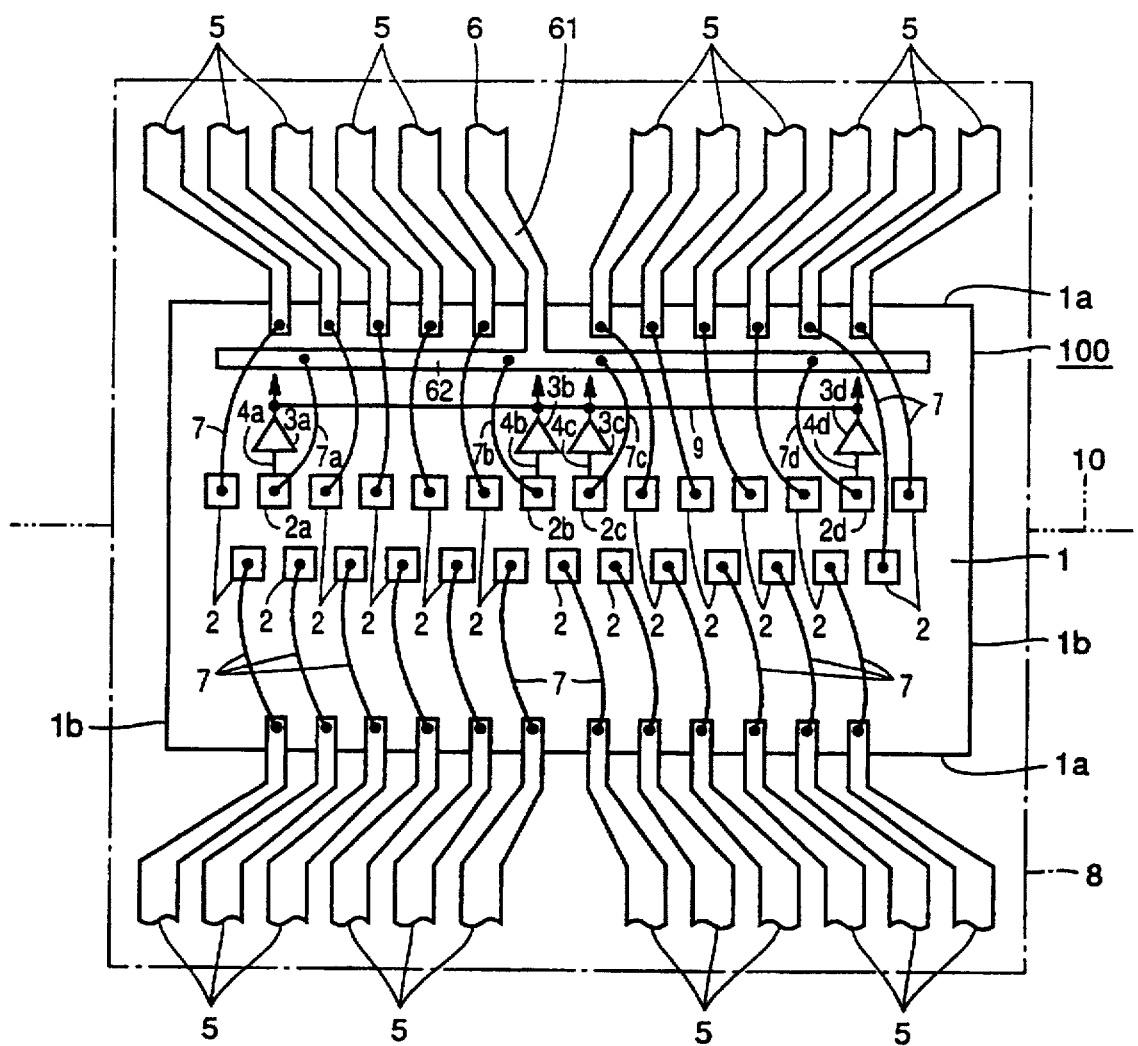

The semiconductor device according to an eighth embodiment of the present invention shown in FIG. 10 differs from the semiconductor device of the seventh embodiment shown in FIG. 9 in that an output interconnection layer 9 formed of a metal layer is additionally provided on an insulating layer (not shown) on the surface of semiconductor substrate 1 for electrically connecting all output nodes 32 of input buffer circuits 3a–3d. The components of FIG. 10 corresponding to those of FIG. 9 have the same reference characters allotted.

The semiconductor device of the eighth embodiment provides advantages similar to those of the seventh embodiment. Since output interconnection layer 9 electrically connects all output nodes 32 of input buffer circuits 3a–3d, the difference in the signal transmission time delay of a control signal arriving at output node 32 of input buffer circuits 3a–3d is suppressed. Semiconductor chip 100 can be controlled at a higher speed.

NINTH EMBODIMENT

Figure 11:
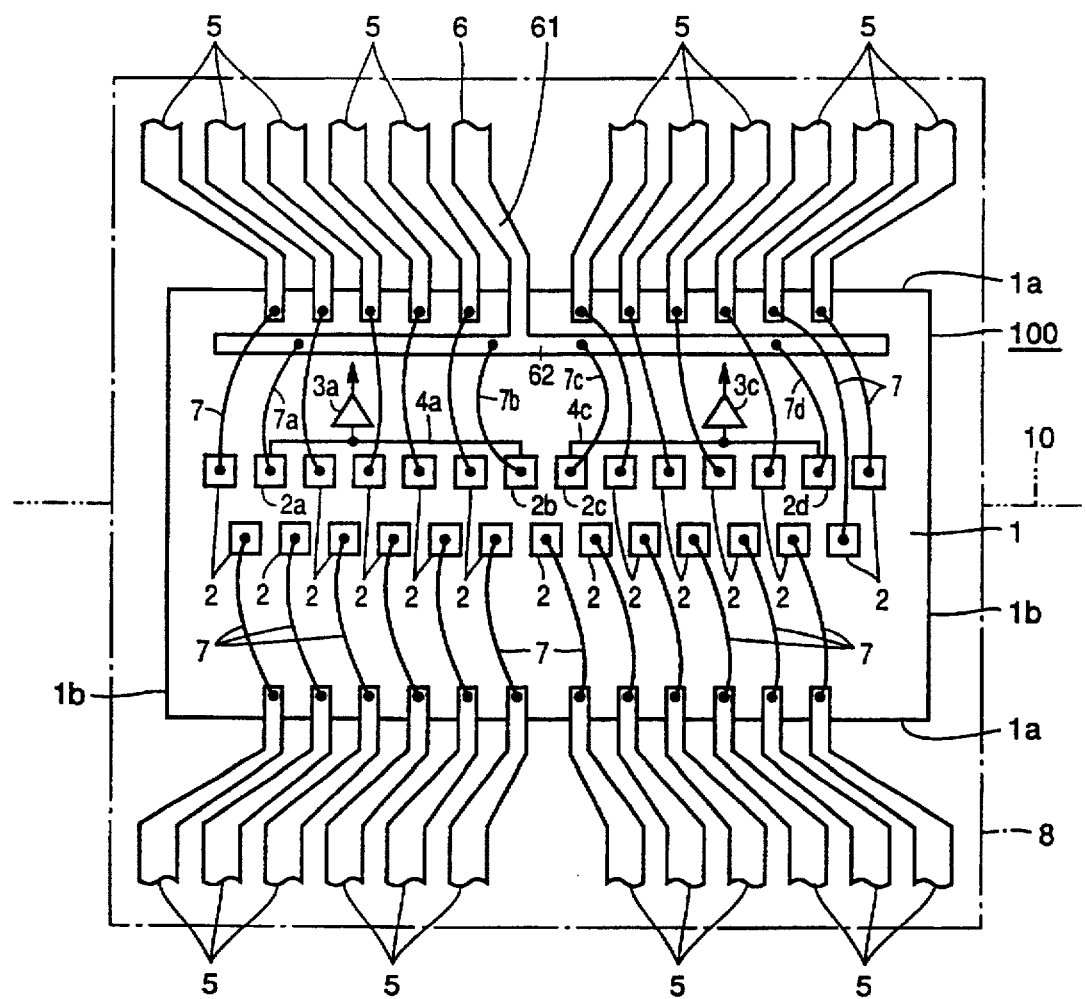

A semiconductor device according to a ninth embodiment of the present invention shown in FIG. 11 differs from the semiconductor device of the seventh embodiment shown in FIG. 9 in that input buffer circuit 3a is provided in common to two bonding pads 2a and 2b, and input buffer circuit 3c is provided in common to two bonding pads 3c and 3d. Input node 31 of input buffer circuit 3a is electrically connected to two bonding pads 2a and 2b via interconnection layer 4a. Input node 31 of input buffer circuit 3c is electrically to bonding pads 2c and 2d via interconnection layer 4c. The remaining elements are similar to those of the seventh embodiment.

The semiconductor device of the ninth embodiment has the plurality of bonding pads 2a–2d receiving the same control signal (four in the ninth embodiment) divided into a plurality of bonding pad groups (two in the ninth embodiment) with input buffer circuits 3a and 3c provided corresponding to respective bonding pad groups. Interconnection layer 4a electrically connects input buffer circuit 3a with bonding pads 2a and 2b of a corresponding bonding pad group. Interconnection layer 4c electrically connects input buffer circuit 3c with bonding pads 2c and 2d of a corresponding bonding pad group.

The components of FIG. 11 corresponding to those of FIG. 9 have the same reference characters allotted.

The semiconductor device of the ninth embodiment provides advantages similar to those of the seventh embodiment.

TENTH EMBODIMENT

Figure 12:
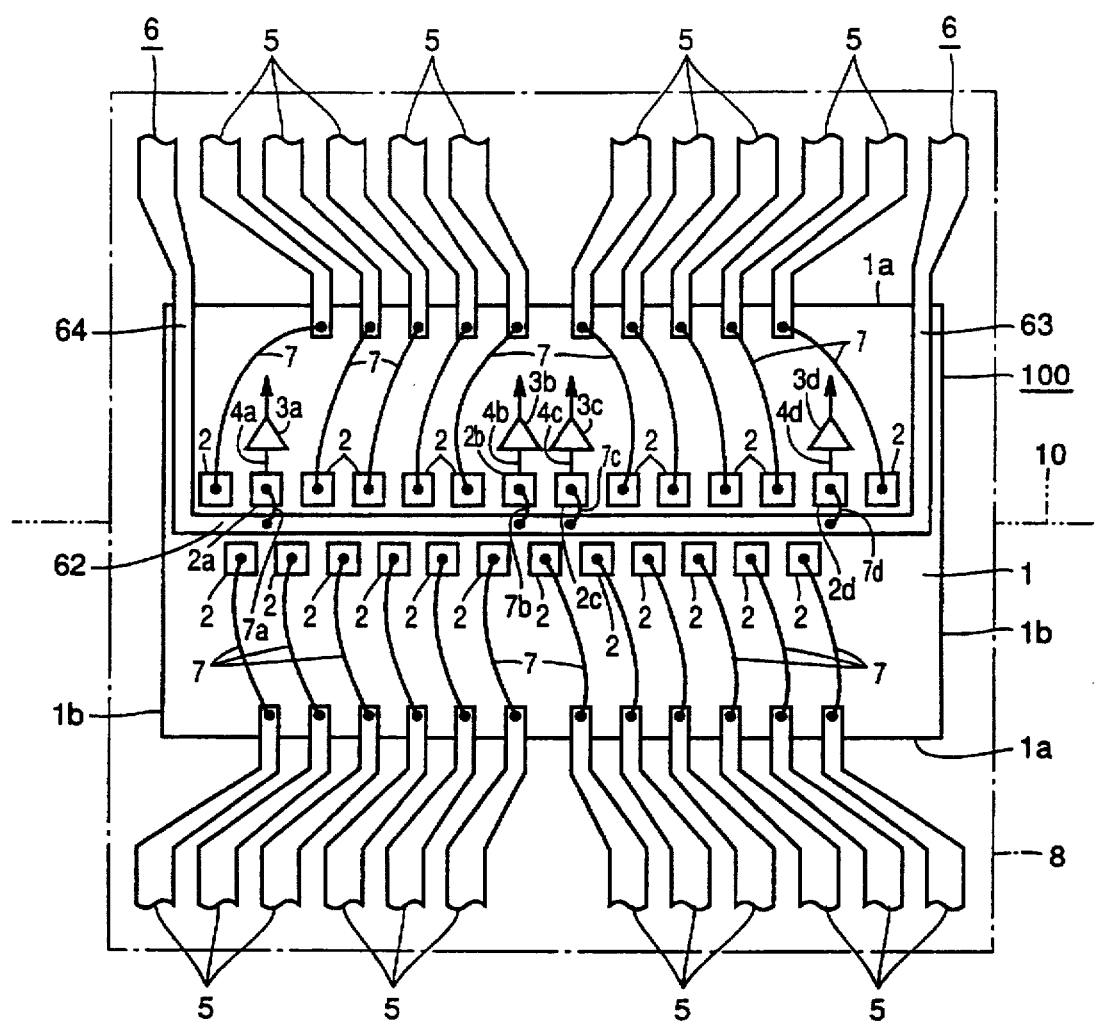

The semiconductor device according to a tenth embodiment of the present invention shown in FIG. 12 differs from the semiconductor device of the first embodiment shown in FIG. 1 in that lead terminal 6 includes first and second sections 63 and 64 in close proximity to respect short sides 1b of semiconductor substrate 1 above the surface of semiconductor substrate 1 (between the outmost bonding pad 2 arranged along center line 10 and short side 1b of semiconductor substrate 1 in the tenth embodiment) for receiving an external control signal at one end, and a connection segment 62 formed integral with the other ends of first and second portions 63 and 64, located parallel to long side 1a of semiconductor substrate 1 above the surface of the semiconductor substrate 1, and between the right side row (the upper row in the drawing) and the left side row (the lower row in the drawing) of bonding pads 2 (on center line 10). Connection segment 62 of lead terminal 6 is electrically connected to bonding pads 2a–2d via metal wires 7a–7d. The remaining elements are similar to those of the first embodiment. Components of FIG. 12 corresponding to those of FIG. 12 have the same reference characters allotted.

The semiconductor device of the tenth embodiment provides advantages similar to those of the first embodiment. Since metal wires 7a–7d are connected by connection segment 62 located parallel to long side 1a of semiconductor substrate 1 at the center and having a length substantially equal to long side 1a, metal wires 7, 7a–7d can be disposed with no crossing therebetween. The connection is facilitated, and margin with respect to electrical shorting between metal wires 7, 7a, 7d is improved. Connection with margin with respect to electrical shorting can be provided.

ELEVENTH EMBODIMENT

Figure 13:
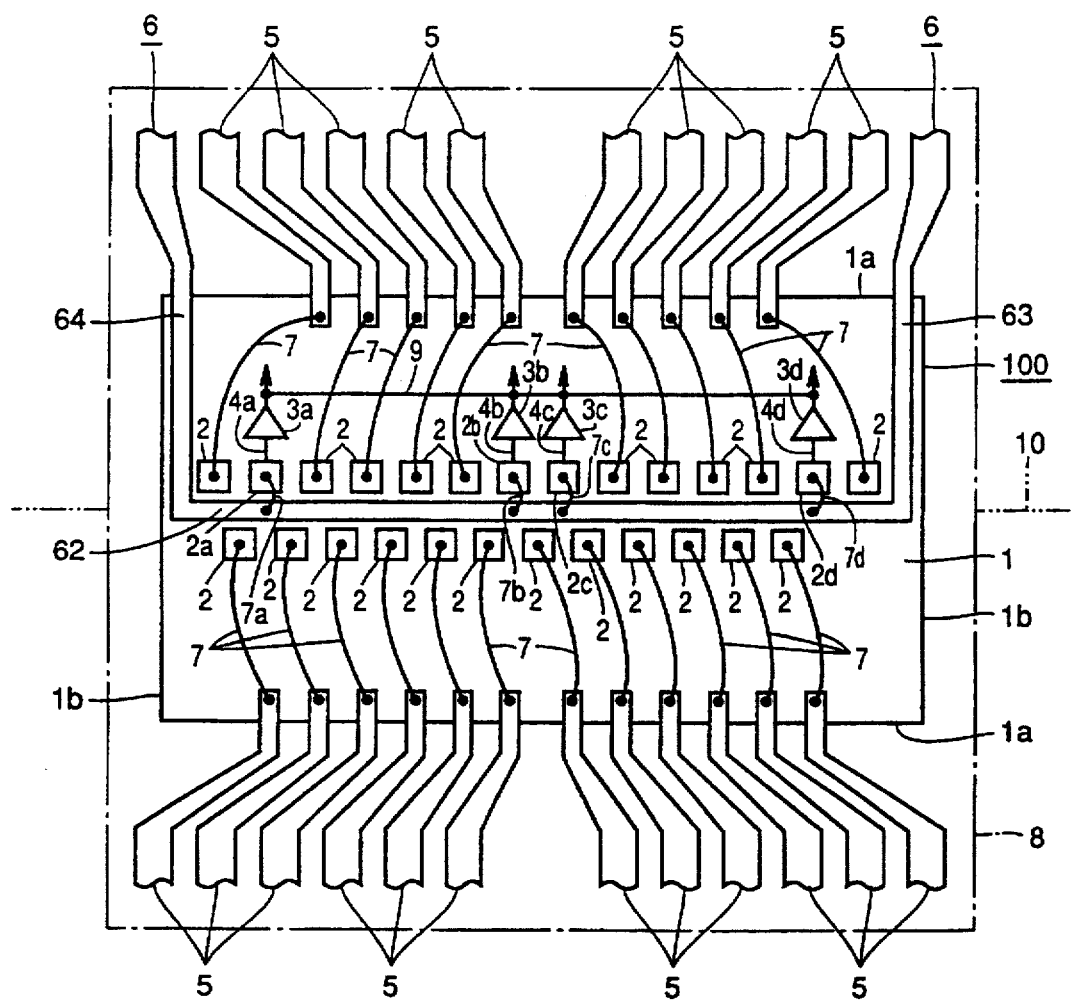

The semiconductor device according to an eleventh embodiment of the present invention shown in FIG. 13 differs from the semiconductor device of the tenth embodiment shown in FIG. 12 in that output interconnection layer 9 formed of a metal layer is additionally provided on an insulating layer (not shown) on the surface of semiconductor substrate 1 for electrically connecting all output nodes 32 of input buffer circuit 3a–3d. The remaining elements are similar to those of the tenth embodiment. Components of FIG. 13 corresponding to those of FIG. 12 have the same reference characters allotted.

The semiconductor device of the eleventh embodiment provides advantages similar to those of the tenth embodiment. Since output interconnection layer 9 electrically connects all output nodes 32 of input buffer circuits 3a–3d, the difference in the signal transmission time delay of a control signal appearing at output node 32 of input buffer circuits 3a–3d can be suppressed. Semiconductor chip 100 can be controlled at a higher speed.

TWELFTH EMBODIMENT

Figure 14:
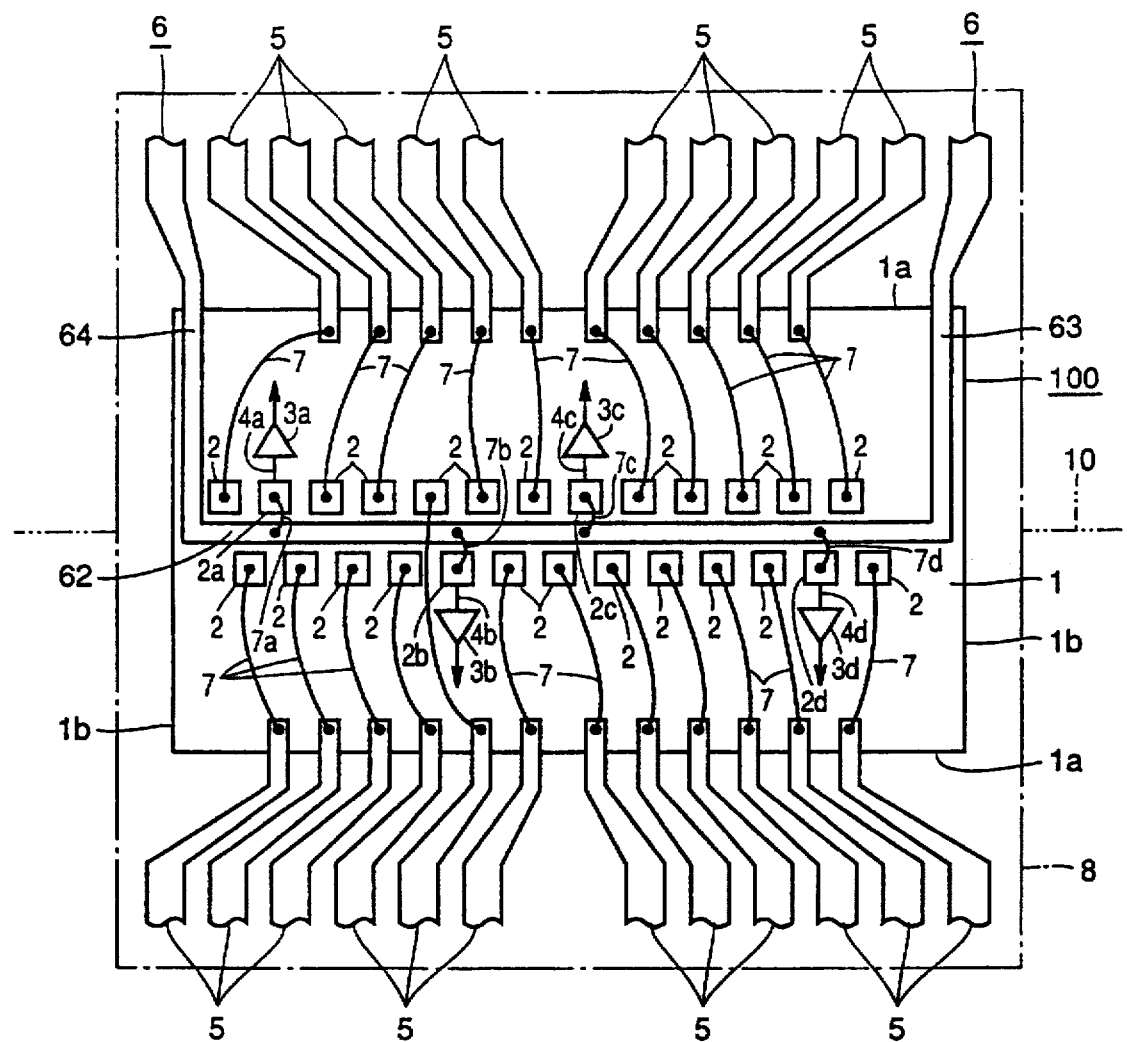

The semiconductor device according to a twelfth embodiment of the present invention shown in FIG. 14 differs from the semiconductor device of the tenth embodiment shown in FIG. 12 having bonding pads 2a–2d receiving the same control signal disposed at the right side row of bonding pads 2 in that a half of bonding pads 2a–2d receiving the same control signal are disposed at the right side row of bonding pads, and the remaining half of the bonding pads 2c and 2d receiving the same control signal are disposed at the left side row of bonding pads 2. The remaining elements are similar to those of the tenth embodiment.

The semiconductor device of the twelfth embodiment has the plurality of bonding pads provided in a right side row and a left side row along center line 10 parallel to the longer side of semiconductor substrate 1. The same control signal is applied to a predetermined number of bonding pads in the right side row and a predetermined number of bonding pads in the left side row. Connection segment 62 of lead terminal 6 is located between the right side row of bonding pads and the left side row of bonding pads. Connection segment 62 of lead terminal 6 is electrically connected to a predetermined number of bonding pads 2a–2d of the right side row and the left side row via metal wires 7a–7d.

Components of FIG. 14 corresponding to those of FIG. 12 have the same reference characters allotted.

The semiconductor device of the twelfth embodiment provides advantages similar to those of the tenth embodiment. The present embodiment is particularly applicable to a DRAM or a synchronous DRAM having a memory cell array divided into four on a semiconductor substrate 1 by a vertical line and a horizontal line wherein each of the four memory cell arrays is controlled by the same control signal.

THIRTEENTH EMBODIMENT

Figure 15:
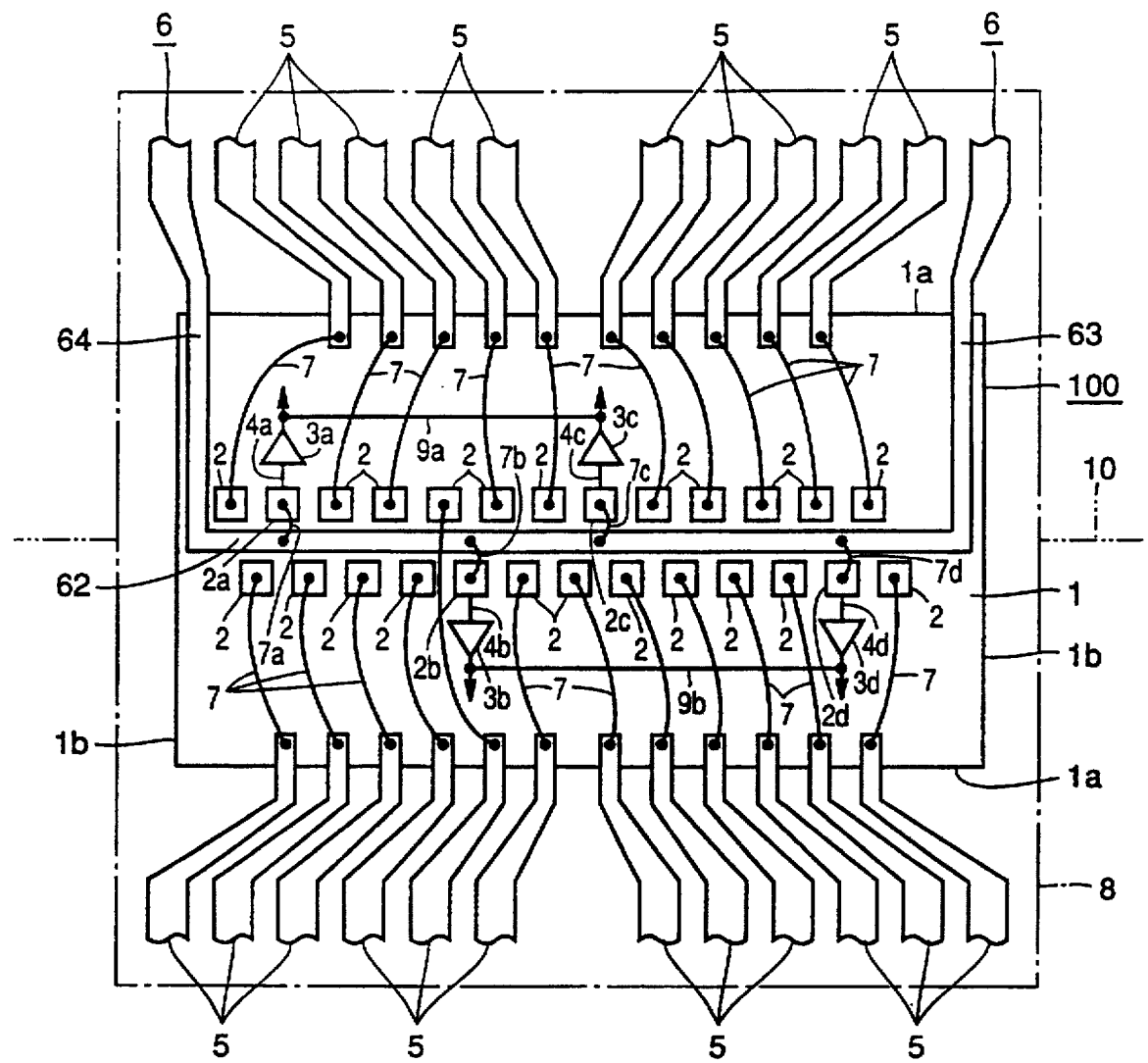

The semiconductor device according to a thirteenth embodiment of the present invention shown in FIG. 15 differs from the semiconductor device of the twelfth embodiment shown in FIG. 14 in that an output interconnection layer 9a formed of a metal layer is electrically provided on an insulating layer (not shown) on the surface of semiconductor substrate 1 for electrically connecting all output nodes 32 of input buffer circuits 3a and 3c connected to bonding pads 2a and 2c of the right side row, and an output interconnection layer 9b formed of a metal layer for electrically connecting all output nodes 32 of input buffer circuits 3b and 3d connected to bonding pads 2b and 2d of the left side row. The remaining elements are similar to those of the twelfth embodiment. The components of FIG. 15 corresponding to those of FIG. 14 have the same reference characters allotted.

The semiconductor device of the thirteenth embodiment provides advantages similar to those of the twelfth embodiment. Since output interconnection layers 9a and 9b respectively electrically connect output nodes 32 of input buffer circuits 3a–3d connected to right side row and left side row of bonding pads 2a–2d, respectively, the difference in signal transmission time delay of a control signal arriving at output node 32 of input buffer circuits 3a–3d is suppressed. Semiconductor chip 100 can be controlled at a further high speed.

FOURTEENTH EMBODIMENT

Figure 16:
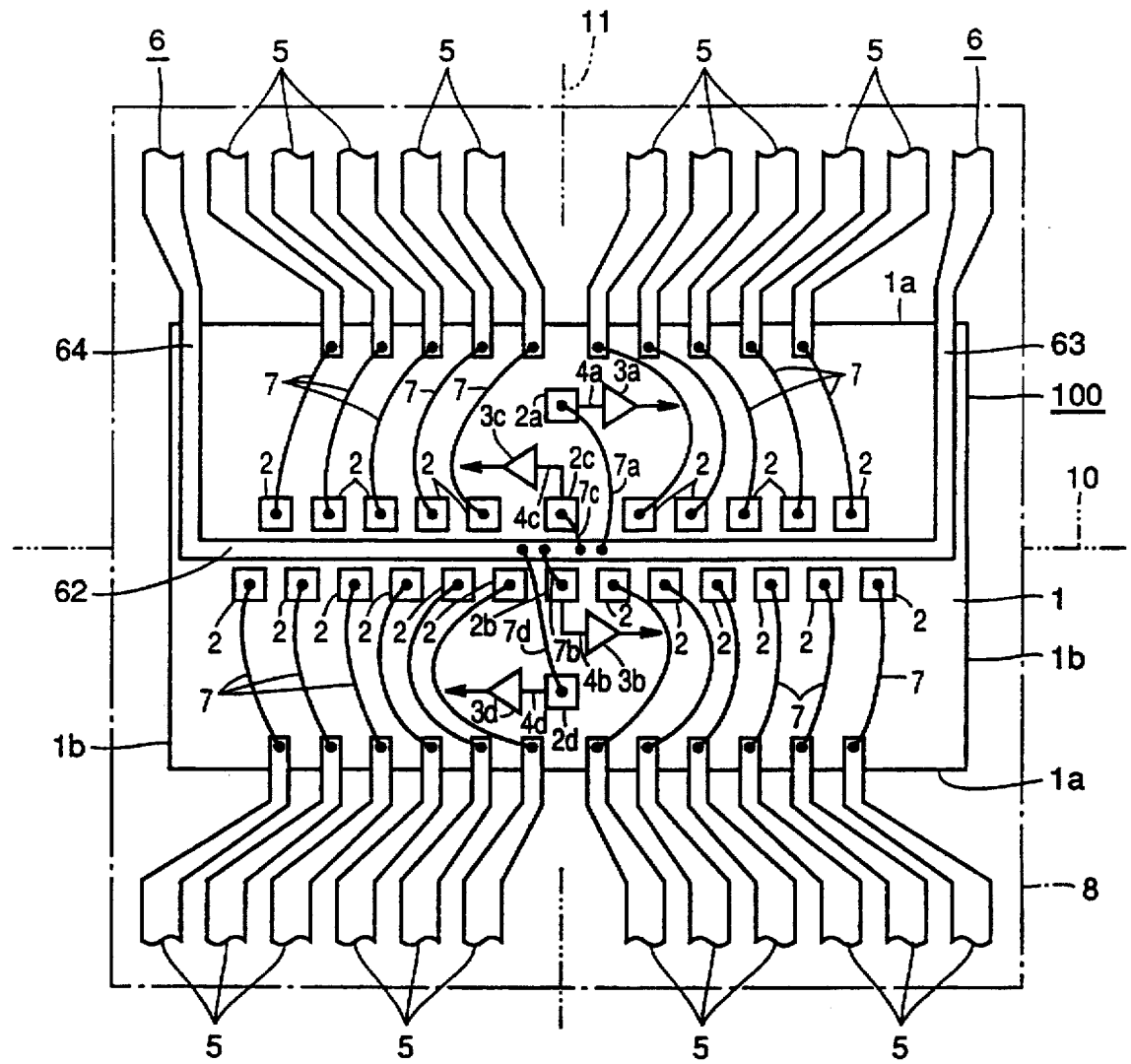

The semiconductor device according to a fourteenth embodiment of the present invention shown in FIG. 16 differs from the semiconductor device of the tenth embodiment shown in FIG. 12 having bonding pads 2a–2d receiving the same control signal disposed along a center line 10 parallel to long side 1a of semiconductor substrate 1 in that bonding pads 2a–2d receiving the same control signal are disposed along a center line 11 parallel to short side 1b of semiconductor substrate 1. The remaining elements are similar to those of the tenth embodiment.

In the semiconductor device of the fourteenth embodiment, a right side row and a left side row of bonding pads 2 are disposed along center line 10 parallel to long side 1a of semiconductor substrate 1 wherein bonding pads 2a–2d receiving the same control signal are disposed along center line 11 parallel to short side 1b of semiconductor substrate 1. More specifically, bonding pads 2a and 2d are located in the proximity of respective long sides 1a of semiconductor substrate 1 and bonding pads 2b and 2c are located at the center portion of semiconductor substrate 1, all along center line 11. Bonding pads 2a–2d are electrically connected with connection segment 62 of lead terminal 6 located between the right side row of bonding pads and left side row of bonding pads by metal wires 7a–7d. A bonding pad may be provided between bonding pads 2a and 2c and also between bonding pads 2b and 2d receiving another control signal.

Components of FIG. 16 corresponding to those of FIG. 12 have the same reference characters allotted.

The semiconductor device of the fourteenth embodiment provides advantages similar to those of the tenth embodiment. The present embodiment is particularly applicable to a DRAM and a synchronous DRAM having a memory cell array divided into four on semiconductor substrate 1 according to one vertical line and one horizontal line wherein each of the four memory cell arrays is controlled with the same control signal. The present embodiment is further advantageous in that pattern arrangement can be carried out effectively since input buffer circuits 3a–3d receiving a predetermined control signal can be disposed along center line 11 parallel to short side 1b of semiconductor substrate 1.

FIFTEENTH EMBODIMENT

Figure 17:
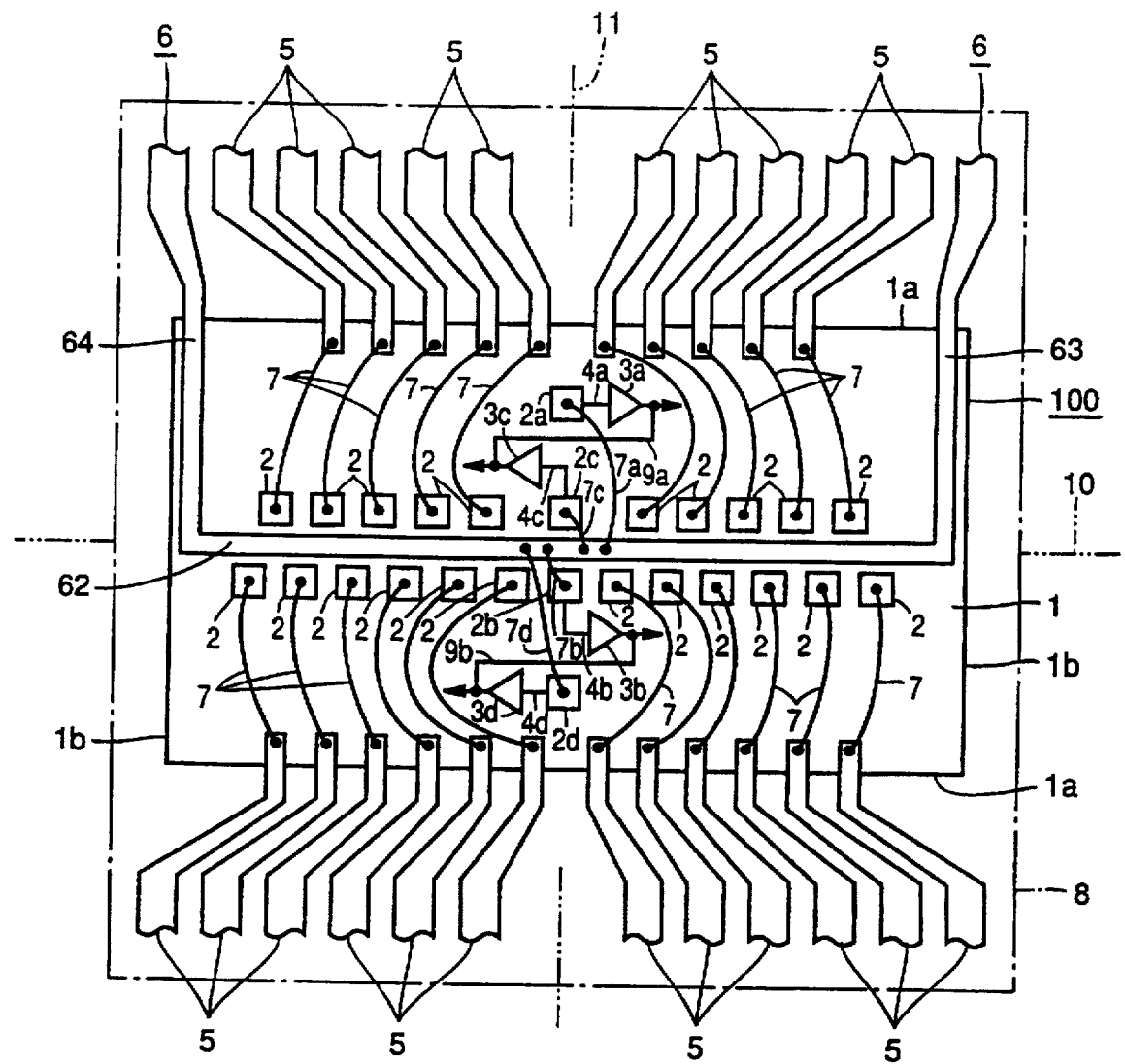

The semiconductor device according to a fifteenth embodiment of the present invention shown in FIG. 17 differs from the semiconductor device of the fourteenth embodiment shown in FIG. 16 in that an output interconnection layer 9a is additionally provided formed of a metal layer and on an insulating layer (not shown) on the surface of semiconductor substrate 1 for electrically connecting all output nodes 32 of input buffer circuits 3a and 3c connected to bonding pads 2a and 2c of the right side (upper side in the drawing) of center line 10, and an output interconnection layer 9b formed of a metal layer is additionally provided on the insulating layer (not shown) on the surface of semiconductor substrate 1 for electrically connecting all output nodes 32 of input buffer circuits 3b and 3d connected to bonding pads 2b and 2d of the left side (the lower row in the drawing) of center line 10. The remaining elements are similar to those of the fourteenth embodiment. The components of FIG. 17 corresponding to those of FIG. 16 have the same reference characters allotted.

The semiconductor device of the fifteenth embodiment provides advantages similar to those of the fourteenth embodiment. Since output interconnection layers 9a and 9b electrically connect output nodes 32 of input buffer circuits 3a–3d connected to bonding pads 2a–2d of the right side row and left side row of bonding pads 2a–2d, difference in signal transmission time delay of a control signal arriving at output node 32 of input buffer circuits 3a–3d is suppressed. Semiconductor chip 100 can further be controlled at a higher speed.

SIXTEENTH EMBODIMENT

Figure 18:
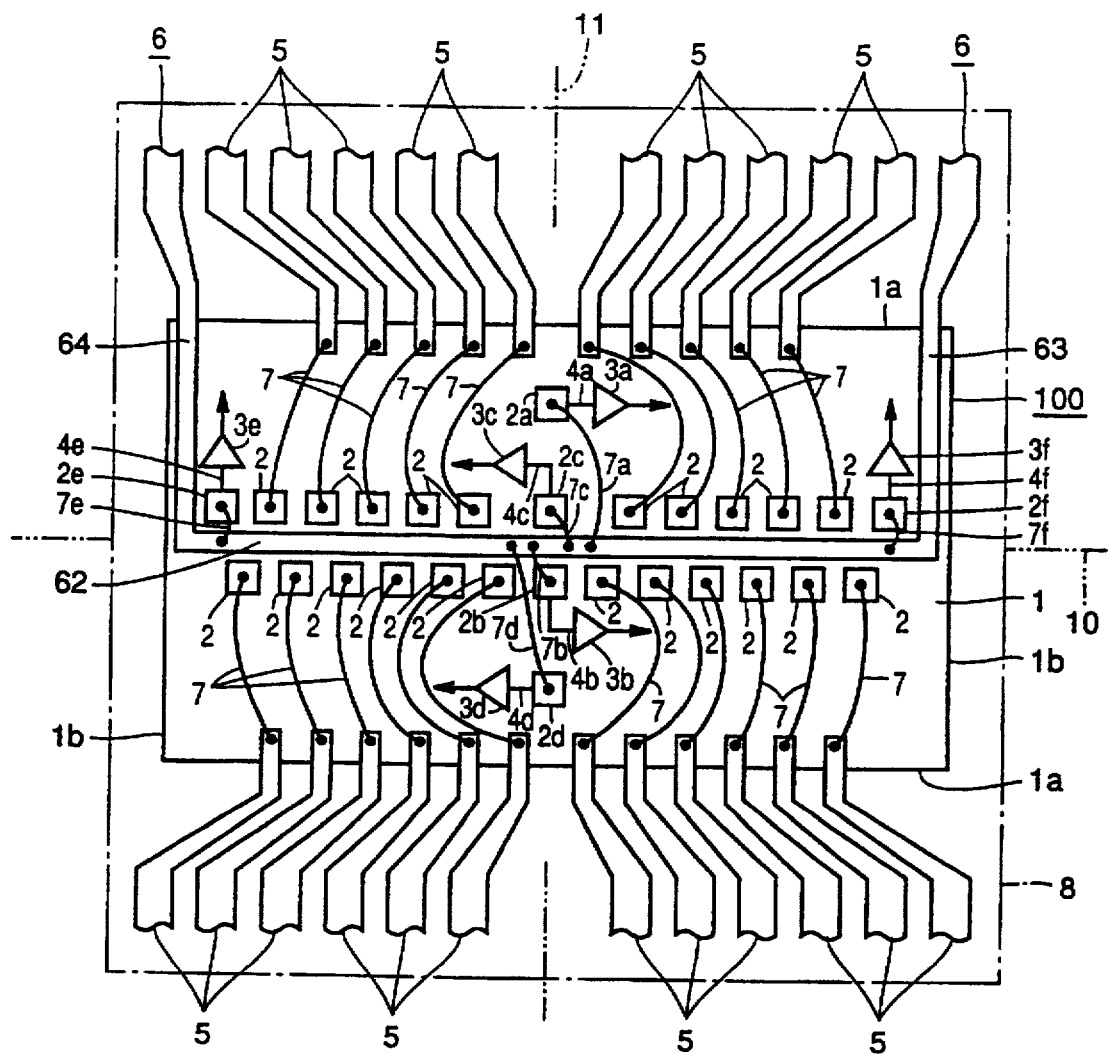

The semiconductor device according to a sixteenth embodiment of the present invention shown in FIG. 18 differs from the semiconductor device of the fourteenth embodiment shown in FIG. 16 in that bonding pads 2e and 2f receiving the same control signal are disposed along center line 10 parallel to long side 1a of semiconductor substrate 1. Furthermore, input buffer circuits 3e and 3f, interconnection layers 4e and 4f, and a desired circuit controlled by the same control signal are provided corresponding to bonding pads 2e and 2f. The remaining elements are similar to those of the tenth embodiment.

In the semiconductor device of the sixteenth embodiment, a long side row and a short side row of bonding pads 2, 2a–2f are disposed along center line 10 parallel to long side 1a and center line 11 parallel to short side 1b of semiconductor substrate 1. The same control signal is applied to a predetermined number of the long side row of bonding pads (two in the sixteenth embodiment) and a predetermined number of the short side row of bonding pads (four in Embodiment 16). Bonding pads 2e and 2f are located in the proximity of respective ends of short side 1b of semiconductor substrate 1. Bonding pads 2e and 2f are electrically connected to connection segment 62 of lead terminal 6 provided between the right side row and left side row of bonding pads by metal wires 7e and 7f, respectively.

The components of FIG. 18 corresponding to those of FIG. 16 have the same reference characters allotted.

The semiconductor device of the present embodiment provides advantages similar to those of the fourteenth embodiment.

SEVENTEENTH EMBODIMENT

Figure 19:
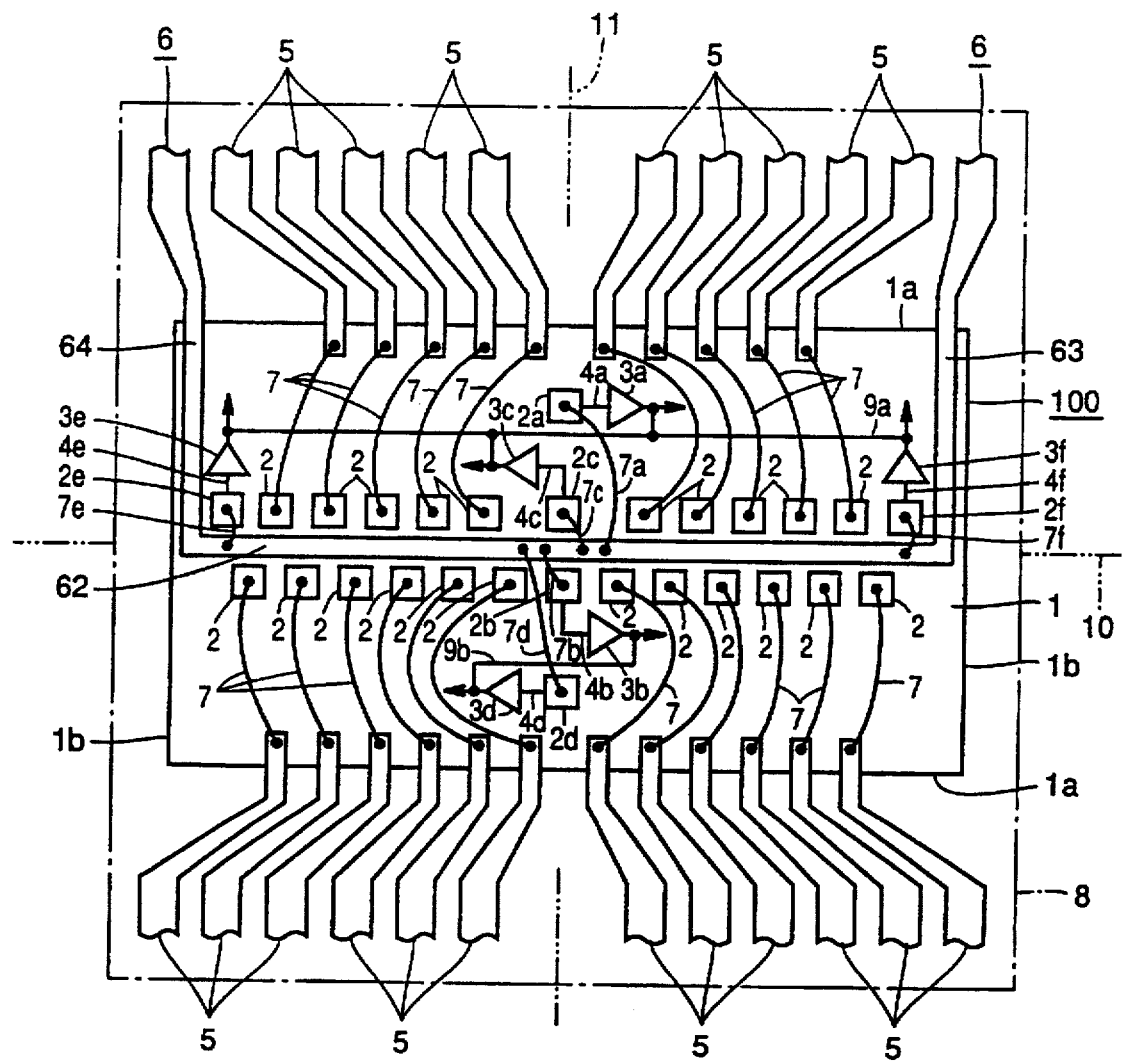

The semiconductor device according to a seventeenth embodiment of the present invention shown in FIG. 19 differs from the semiconductor device of the sixteenth embodiment shown in FIG. 18 in that an output interconnection layer 9a formed of a metal layer is additionally provided on an insulating layer (not shown) on the surface of semiconductor substrate 1 for electrically connecting all output nodes 32 of input buffer circuits 3a, 3c, 3e and 3f connected to bonding pads 2a, 2c, 2e and 2f, respectively, at the right side (upper side in the drawings) of center line 10, and that an output interconnection layer 9b formed of a metal layer is additionally provided for electrically connecting all output nodes 32 of input buffer circuits 3b and 3d connected to bonding pads 2b and 2d at the left side (the lower side in the drawing) of center line 10. The remaining elements are similar to those of the sixteenth embodiment. Components of FIG. 19 corresponding to those of FIG. 17 have the same reference characters allotted.

The semiconductor device of the seventeenth embodiment provides advantages similar to those of the sixteenth embodiment. Since output nodes 32 of input buffer circuits 3a–3f connected to the right side and left side bonding pads 2a–2f are electrically connected by output interconnection layers 9a and 9b, difference in signal transmission time delay of a control signal arriving at output node 32 of input buffer circuits 3a–3f is suppressed. Thus, semiconductor chip 100 can be controlled at a higher speed.

EIGHTEENTH EMBODIMENT

Figure 20:
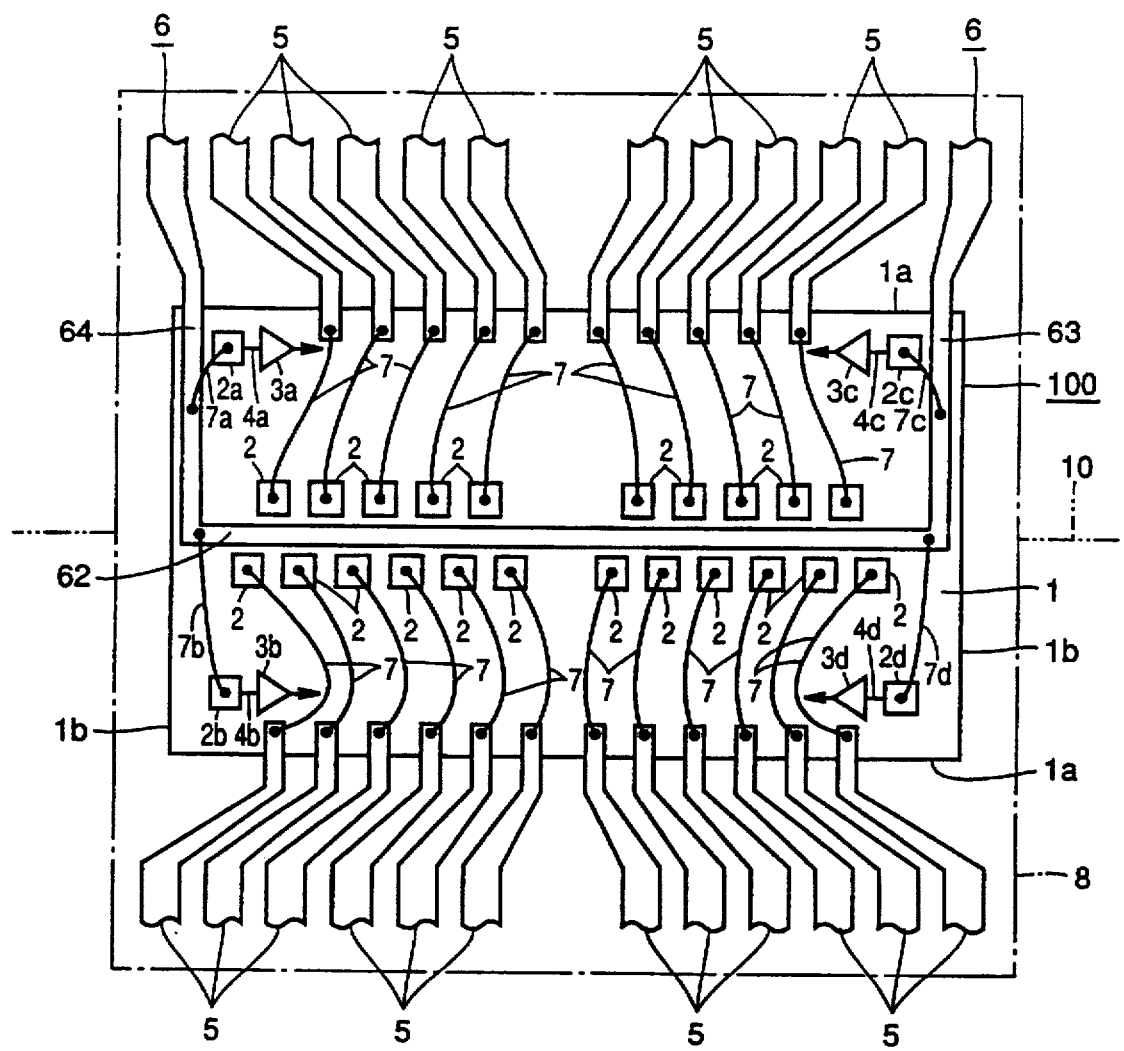

The semiconductor device according to an eighteenth embodiment of the present invention shown in FIG. 20 differs from the semiconductor device of the tenth embodiment shown in FIG. 12 having bonding pads 2a–2d receiving the same control signal disposed along center line 10 parallel to long side 1a of semiconductor device 1 in that bonding pads 2a–2d receiving the same control signal are provided at the four corners of semiconductor substrate 1. The remaining elements are similar to those of the tenth embodiment.

More specifically, bonding pads 2a, 2b, 2c, and 2d are located at an upper left corner, a lower left corner, an upper right corner, and a lower right corner, respectively, of semiconductor substrate 1. Each of bonding pads 2a–2d is electrically connected to a relevant portion of first and second sections 63 and 64 and connection segment 63 of lead terminal 6 that is most feasible to connect by metal wires 7a–7d.

Components of FIG. 20 corresponding to those of FIG. 12 have likewise reference characters allotted.

The semiconductor device according to the eighteenth embodiment of the present invention provides advantages similar to those of the tenth embodiment. The present embodiment is particularly applicable to a DRAM and a synchronous DRAM having a memory cell array divided into 4 on semiconductor substrate 1 according to one vertical line and one horizontal line wherein each of the four memory cell arrays is controlled by the same control signal.

NINETEENTH EMBODIMENT

Figure 21:
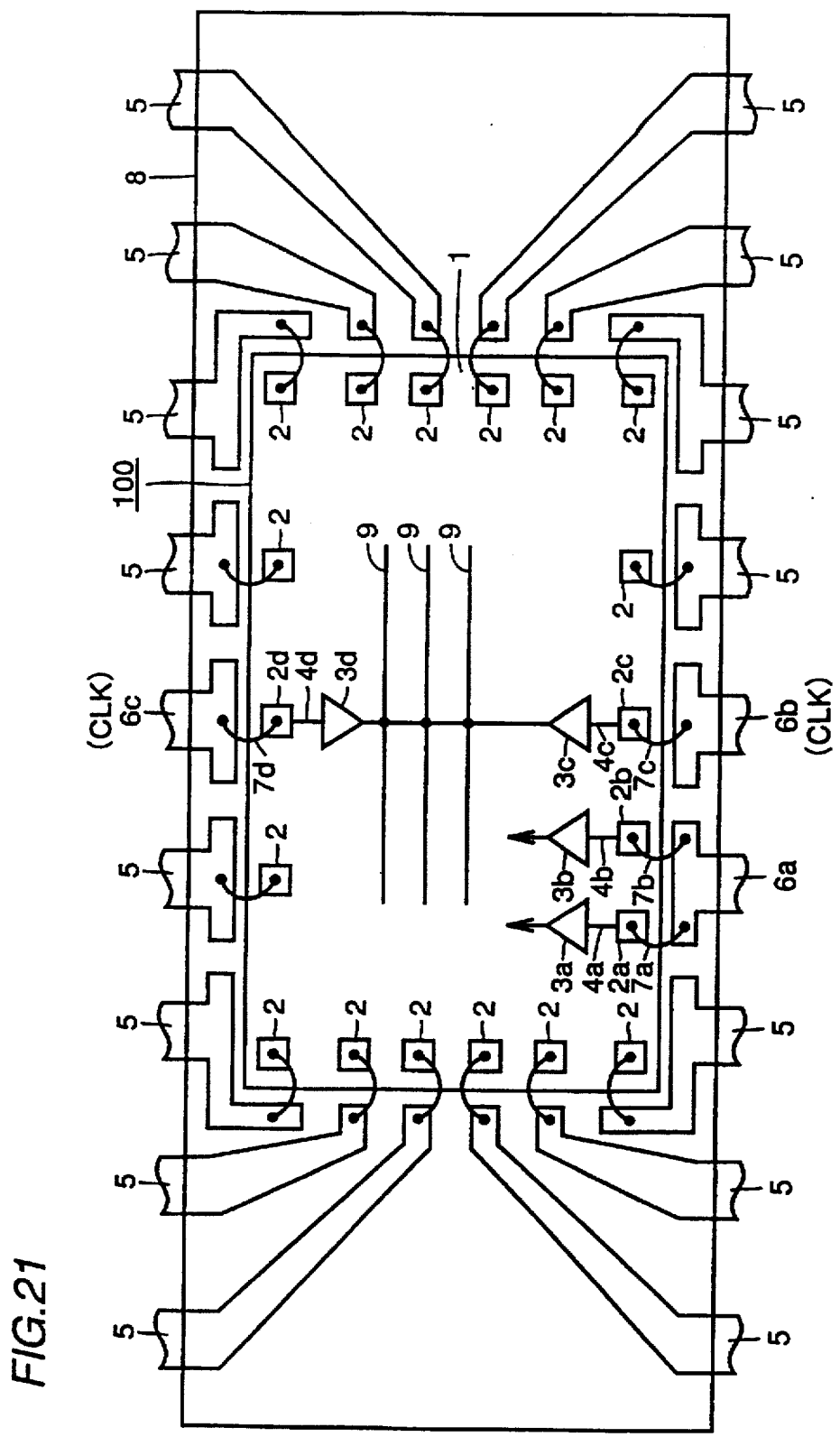
Figure 22:
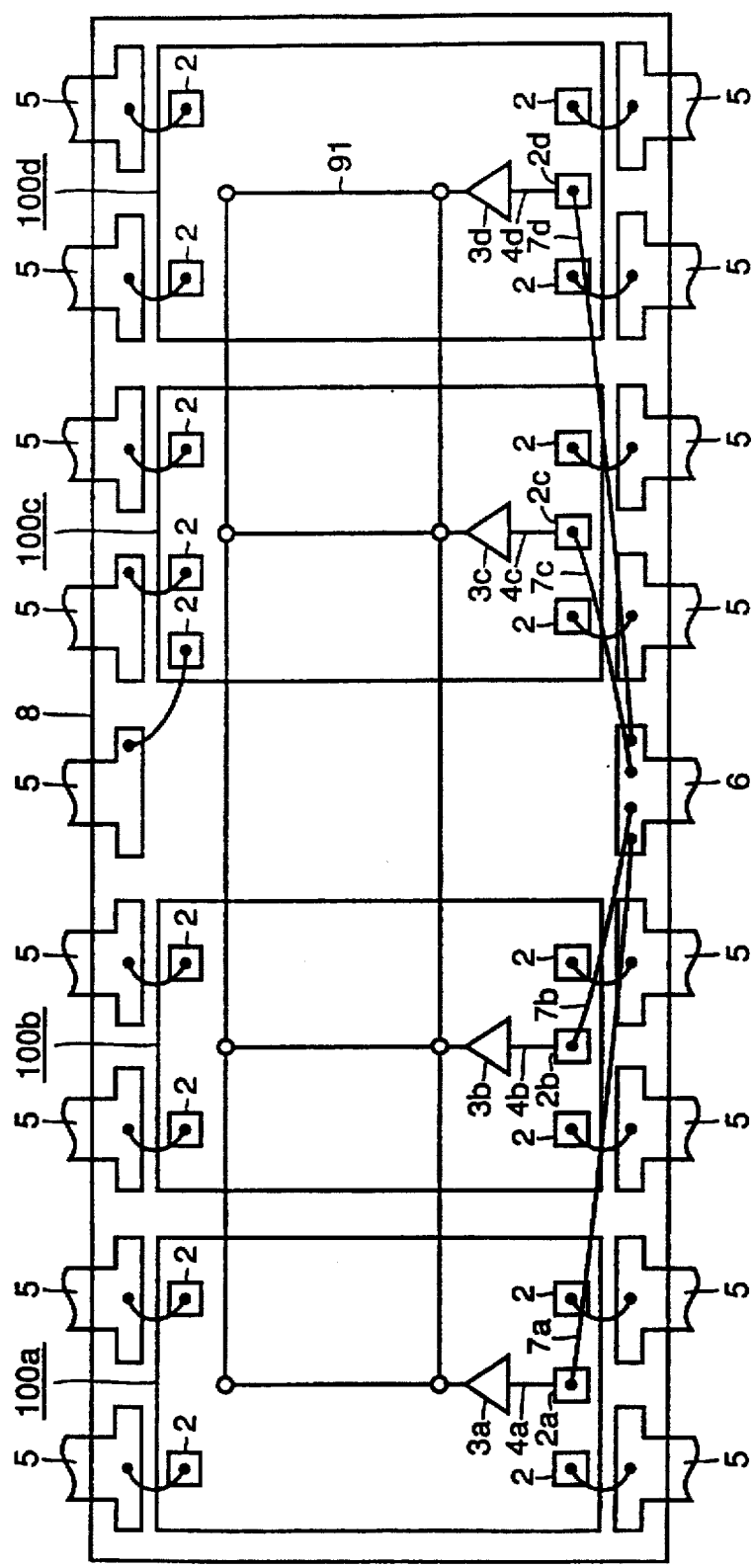

The semiconductor device according to a nineteenth embodiment of the present invention shown in FIG. 21 differs from the previous embodiments of 1–18 employing an LOC (Lead On Chip) structure having bonding pads 2, 2a, 2b, 2c, 2d disposed along center line 10 of semiconductor substrate 1 in that bonding pads 2, 2a, 2b, 2c and 2d are disposed at the periphery of semiconductor substrate 1, and the LOC structure is not employed. In the semiconductor device of the nineteenth embodiment, bonding pads 2a and 2b are connected to same lead terminal 6a via metal wires 7a and 7b, respectively, to receive the same control signal. Input buffer circuits 3a and 3b provided corresponding to bonding pads 2a and 2b are electrically connected to bonding pads 2a and 2b by metal wires 4a and 4b, respectively.

Bonding pads 2c and 2d are connected to lead terminals 6b and 6c receiving the same clock signal CLK via metal wires 7c and 7d, respectively. Input buffer circuits 3c and 3d provided corresponding to bonding pads 2c and 2d are connected thereto by metal wires 4c and 4d, respectively, and also connected in common to output interconnection 9. The semiconductor device according to the nineteenth embodiment provides advantages similar to those of the first and second embodiments.

TWENTIETH EMBODIMENT

The semiconductor device according to a twentieth embodiment of the present invention differs from the semiconductor device of the first to the eighteenth embodiments having the same control signal applied to bonding pads 2a and 2b on one chip 100 in that the same control signal is applied to bonding pads 2a, 2b, 2c and 2d of each of chips 100a, 100b, 100c and 100d in a multi-chip module in one package. Bonding pads 2a, 2b, 2c and 2d in respective semiconductor chips are connected to the same lead terminal 6 by metal wires 7a, 7b, 7c and 7d, respectively, to receive the same control signal. Input buffer circuits 3a, 3b, 3c and 3d arranged corresponding to bonding pads 2a, 2b, 2c, and 2d are connected to a corresponding one of bonding pads 2a, 2b, 2c and 2d, respectively, by metal wires 4a, 4b, 4c and 4d, respectively. Input buffer circuits 3a, 3b, 3c and 3d are connected to an output interconnection including a metal interconnection 91 provided over semiconductor chips 100a, 100b, 100c and 100d.

Since bonding pads 2a, 2b, 2c and 2d are connected to lead terminal 6 via metal wires 7a, 7b, 7c and 7d in the semiconductor device of the twentieth embodiment, there is almost no difference in signal transmission time delay of the control signals arriving at bonding pads 2a, 2b, 2c and 2d. Since bonding pads 2a, 2b, 2c and 2d receiving the same control signal are provided in each of semiconductor chips 100a, 100b, 100c, and 100d, the interconnection 4a, 4b, 4c, and 4d between bonding pads 2a, 2b, 2c and 2d and input buffer circuits 3a, 3b, 3c and 3d, respectively in each of semiconductor chips 100a, 100b, 100c and 100d can be reduced in length. As a result, difference in a control signal delay can be minimized.

Furthermore, difference in signal transmission time delay of a control signal arriving at an output node of input buffer circuit 3a, 3b, 3c and 3d is suppressed since output nodes of input buffer circuits 3aa, 3b, 3c and 3d are electrically connected to each other by metal interconnection 91.

TWENTY-FIRST EMBODIMENT

Figure 23:
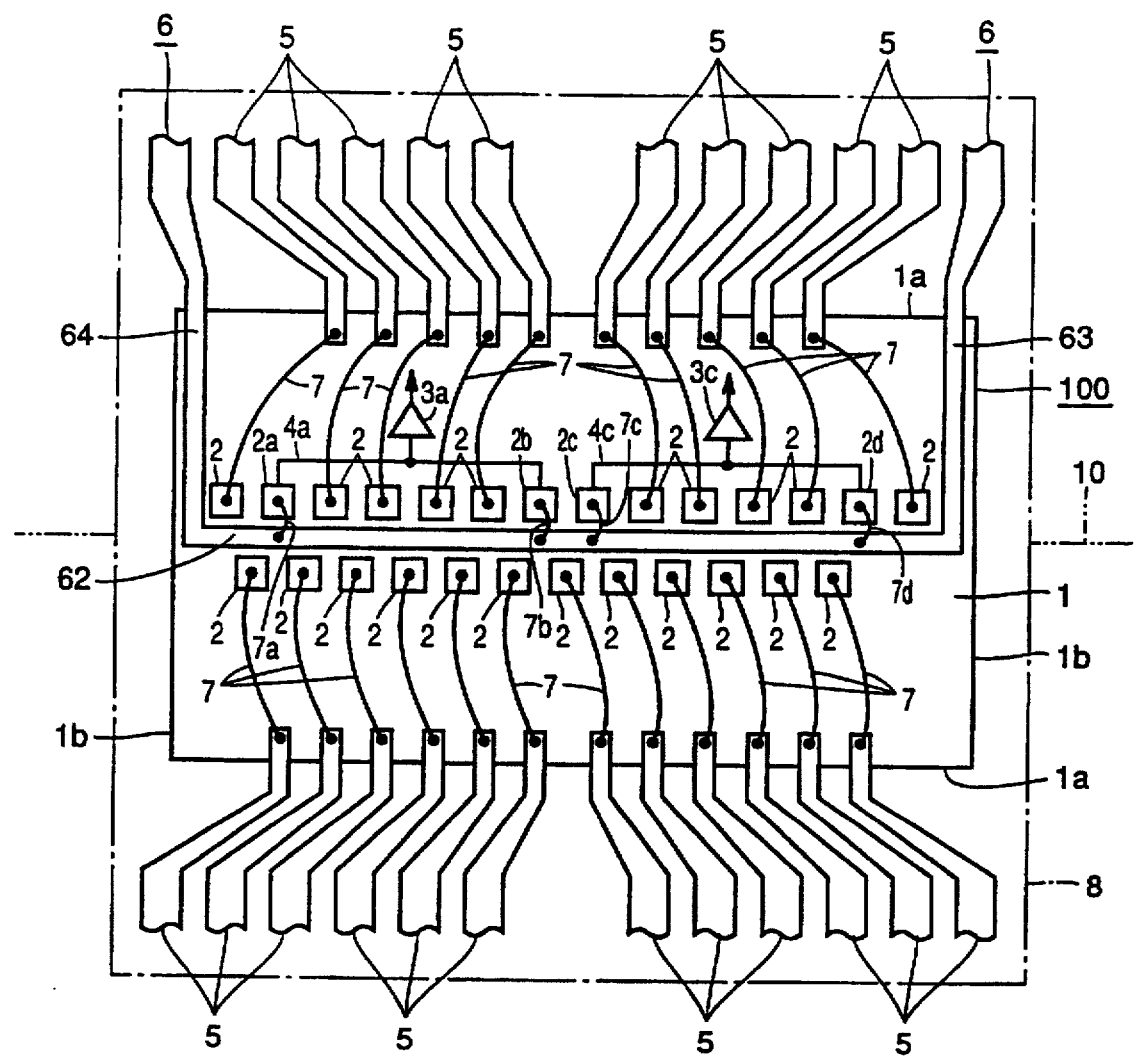

The semiconductor device according to a twenty-first embodiment of the present invention shown in FIG. 23 differs from the semiconductor device of the tenth embodiment shown in FIG. 12 in that input buffer circuit 3a is provided in common to two bonding pads 2a and 2b, and input buffer circuit 3c is provided in common to two bonding pads 2c and 2d. Furthermore, input node 31 of input buffer circuit 3a is electrically connected to bonding pads 2a and 2b by interconnection layer 4a. Input node 31 of input buffer circuit 3c is electrically connected to bonding pads 2c and 2d via interconnection layer 4c. The remaining elements are similar to those of the tenth embodiment.

In the semiconductor device of the twenty-first embodiment, bonding pads 2a–2d receiving the same control signal (four in the twenty-first embodiment) is divided into a plurality of bonding pad groups (two in the twenty-first embodiment). Input buffer circuits 3a and 3c are provided corresponding to respective bonding pad groups. Input buffer circuit 3a is electrically connected to bonding pads 2a and 2b of a corresponding bonding pad group via interconnection layer 4a. Input buffer circuit 3c is electrically connected to bonding pads 2c and 2d of a corresponding bonding pad group via interconnection layer 4c.

The components of FIG. 23 corresponding to those of FIG. 12 have the same reference characters denoted.

The semiconductor device of the twenty-first embodiment provides advantages similar to those of the tenth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
  a semiconductor chip including
    plurality of bonding pads formed on an insulating layer on a surface of a semiconductor substrate, each bonding pad receiving the same control signal,
    a plurality of input buffer circuits provided corresponding to said plurality of bonding pads and formed on the surface of said semiconductor substrate, each for receiving said control signal at an input node and providing a signal according to said control signal to an output node thereof,
    a plurality of input interconnection layers provided corresponding to said plurality of input buffer circuits and formed on the insulating layer on the surface of said semiconductor substrate, each input interconnection layer electrically connecting an input node of a corresponding input buffer circuit with a corresponding bonding pad, and
    an output interconnection layer of a metal wire formed on the insulating layer on the surface of said semiconductor substrate for electrically connecting output nodes of said plurality of input buffer circuits,
  a lead terminal provided corresponding to said plurality of bonding pads for receiving said control signal, and
  a plurality of metal wires provided corresponding to said plurality of bonding pads, each metal wire electrically connecting a corresponding bonding pad with said lead terminal.

2. A semiconductor device comprising:
  a semiconductor chip including
    a plurality of bonding pad groups formed on an insulating layer on a surface of a semiconductor substrate, each bonding group including a plurality of bonding pads to which the same control signal is applied,
    a plurality of input buffer circuits provided corresponding to said plurality of bonding pad groups and formed on the surface of said semiconductor substrate, each for receiving said control signal at an input node and providing a signal according to said control signal to an output node, and
    a plurality of interconnection layers of a metal wire provided corresponding to said plurality of bonding pad groups and formed on the insulating layer on the surface of said semiconductor substrate, each interconnection layer electrically connecting said plurality of bonding pads of a corresponding bonding pad group with an input node of a corresponding input buffer circuit,
  lead terminals provided corresponding to said plurality of bonding pad groups for receiving said control signal, and
  a plurality of metal wires provided corresponding to said plurality of bonding pads, each metal wire electrically connecting a corresponding bonding pad with said lead terminal.

3. A semiconductor device comprising:
  a semiconductor chip including
    a plurality of bonding pad groups formed on an insulating layer on a surface of a semiconductor substrate, each bonding pad group including a plurality of bonding pads to which the same control signal is applied,
    a plurality of input buffer circuits provided corresponding to the plurality of bonding pads of said plurality of bonding pad groups and formed on the surface of said semiconductor substrate, each for receiving said control signal at an input node and providing a signal according to said control signal to an output node, and
    a plurality of interconnection layers of a metal layer provided corresponding to said plurality of input buffer circuits and formed on the insulating layer on the surface of said semiconductor substrate, each interconnection layer electrically connecting an input node of a corresponding input buffer circuit with a corresponding bonding pad,
  a plurality of lead terminals provided corresponding to said plurality of bonding pad groups, each lead terminal receiving said control signal, and
  a plurality of metal wire groups provided corresponding to said plurality of bonding pad groups, and each group including a plurality of metal wires, each metal wire electrically connecting a corresponding bonding pad of a corresponding bonding pad group with a corresponding lead terminal, wherein said semiconductor chip further includes an output interconnection layer formed on the insulating layer on the surface of said semiconductor substrate for electrically connecting output nodes of said plurality of input buffer circuits.

4. A semiconductor device comprising:
  a semiconductor chip including
    a plurality of bonding pad groups formed on an insulating layer on a surface of a semiconductor substrate, each bonding pad group including a plurality of bonding pads to which the same control signal is applied,
    a plurality of input buffer circuits provided corresponding to said plurality of bonding pad groups and formed on the surface of said semiconductor substrate, each for receiving said control signal at an input node and providing a signal according to said control signal to an output node, and
    a plurality of interconnection layers of a metal layer provided corresponding to said plurality of bonding pad groups and formed on the insulating layer on the surface of said semiconductor substrate, each interconnection layer electrically connecting the plurality of bonding pads of a corresponding bonding pad group with an input node of a corresponding input buffer circuit,
  a plurality of lead terminals provided corresponding to said plurality of bonding pad groups, each lead terminal receiving said control signal, and
  a plurality of metal wire groups provided corresponding to said plurality of bonding pad groups, and each group including a plurality of metal wires, each metal wire electrically connecting a corresponding bonding pad of a corresponding bonding pad group with a corresponding lead terminal.

5. A semiconductor device comprising:
a semiconductor chip including
- a rectangular semiconductor substrate having longer sides and shorter sides,
- a plurality of bonding pads formed on an insulating layer on a surface of said semiconductor substrate, each bonding pad receiving the same control signal,
- a plurality of input buffer circuits provided corresponding to said plurality of bonding pads and formed on the surface of said semiconductor substrate, each for receiving said control signal at an input node and providing a signal according to said control signal to an output node, and
- a plurality of interconnection layers of a metal layer provided corresponding to said plurality of input buffer circuits and formed on the insulating layer on the surface of said semiconductor substrate, each interconnection layer electrically connecting an input node of a corresponding input buffer circuit with a corresponding bonding pad, a lead terminal provided corresponding to said plurality of bonding pads, and including a lead segment having one end receiving externally applied said control signal, and a connection segment formed integral with the other end of said lead segment, and parallel to the longer side of said semiconductor substrate, and a plurality of metal wires provided corresponding to said plurality of bonding pads, each metal wire electrically connecting a corresponding bonding pad with said lead terminal.

6. The semiconductor device according to claim 5, wherein said semiconductor chip further includes an output interconnection layer of a metal layer formed on the insulating layer on the surface of said semiconductor substrate for electrically connecting output nodes of said plurality of input buffer circuits.

7. The semiconductor device according to claim 6, wherein said lead segment of said lead terminal includes first and second sections in close proximity to respective shorter sides of said semiconductor substrate for receiving externally applied said control signal at one end, and
wherein said connection segment of said lead terminal is located between the other ends of said first and second sections of said lead segment.

8. The semiconductor device according to claim 5, wherein said lead segment of said lead terminal includes first and second sections in close proximity to respective shorter sides of said semiconductor substrate for receiving externally applied said control signal at one end, and
wherein said connection segment of said lead terminal is located between the other ends of said first and second sections of said lead segment.

9. The semiconductor device according to claim 5, wherein said plurality of bonding pads are arranged along a center line parallel to a longer side of said semiconductor substrate, such that a bonding pad to which another control signal is applied is provided between at least two bonding pads.

10. The semiconductor device according to claim 9, wherein said lead segment of said lead terminal includes first and second sections in close proximity to respective shorter sides of said semiconductor substrate for receiving externally applied said control signal at one end, and
wherein said connection segment of said lead terminal is located between the other ends of said first and second sections of said lead segment.

11. The semiconductor device according to claim 9, wherein said semiconductor chip further includes an output interconnection layer of a metal layer formed on the insulating layer on the surface of said semiconductor substrate for electrically connecting output nodes of said plurality of input buffer circuits.

12. A semiconductor device comprising:
a semiconductor chip including
- a plurality of bonding pad groups formed on an insulating layer on a surface of a semiconductor substrate, each bonding pad group including a plurality of bonding pads receiving the same control signal,
- a plurality of input buffer circuits provided corresponding to said plurality of bonding pad groups and formed on the surface of said semiconductor substrate, each for receiving said control signal at an input node and providing a signal according to said control signal to an output node, and
- a plurality of interconnection layers of a metal layer provided corresponding to said plurality of bonding pad groups and formed on the insulating layer on the surface of said semiconductor substrate, each interconnection layer electrically connecting said plurality of bonding pads of a corresponding bonding pad group with an input node of a corresponding input buffer circuit, a lead terminal provided corresponding to the plurality of bonding pads of said bonding pad groups, and including a lead segment for receiving externally applied said control signal at one end, and a connection segment formed integral with the other end of said lead segment, and parallel to the longer side of said semiconductor substrate, and a plurality of metal wires provided corresponding to said plurality of bonding pads of said plurality of bonding pad groups, each metal wire electrically connecting a corresponding bonding pad with said lead terminal.

13. The semiconductor device according to claim 12, wherein said lead segment of said lead terminal includes first and second sections in close proximity to respective shorter sides of said semiconductor substrate for receiving externally applied said control signal at one end, and
wherein said connection segment of said lead terminal is located between the other ends of said first and second sections of said lead segment.

14. A semiconductor device comprising:
a semiconductor chip including
- a rectangular semiconductor substrate having longer sides and shorter sides,
- a plurality of bonding pads formed on an insulating layer on a surface of said semiconductor substrate, including a right side row and a left side row of bonding pads arranged along a center line parallel to the longer side of said semiconductor substrate, and having the same control signal applied to a predetermined number of bonding pads of said right side row and a predetermined number of bonding pads of said left side row,
- a plurality of input buffer circuits provided corresponding to said predetermined number of bonding pads of right side row and left side row and formed on the surface of said semiconductor substrate, each for receiving said control signal at an input node and providing a signal according to said control signal to an output node, and
- a plurality of interconnection layers provided corresponding to said plurality of input buffer circuits and formed on the insulating layer on the surface of said semiconductor substrate, each interconnection layer electrically connecting an input node of a corresponding input buffer circuit with a corresponding bonding pad, a lead terminal provided corresponding to said predetermined number of said right side row and left side row of bonding pads, and including a lead segment for receiving externally applied said control signal at one end, and a connection segment formed integral with the other end of said lead segment, parallel to the longer side of said semiconductor substrate, and located between said right side row and left side row of bonding pads, and a plurality of metal wires provided corresponding to said predetermined number of bonding pads of the right side row and the left side row, each metal wire electrically connecting a corresponding bonding pad and said connection segment of said lead terminal.

15. The semiconductor device according to claim 14, wherein said lead segment of said lead terminal includes first and second sections in close proximity to respective shorter sides of said semiconductor substrate for receiving externally applied said control signal at one end, and wherein said connection segment of said lead terminal is located between the other ends of said first and second sections of said lead segment.

16. The semiconductor device according to claim 15, wherein said semiconductor chip further includes an output interconnection layer formed on the insulating layer on the surface of said semiconductor substrate for electrically connecting output nodes of said plurality of input buffer circuits.

17. The semiconductor device according to claim 14, wherein said semiconductor chip further includes an output interconnection layer formed on the insulating layer on the surface of said semiconductor substrate for electrically connecting output nodes of said plurality of input buffer circuits.

18. A semiconductor device comprising:

a semiconductor chip including a rectangular semiconductor substrate having longer sides and shorter sides, a plurality of bonding pads formed on an insulating layer on a surface of said semiconductor substrate arranged along a center line parallel to the shorter side of said semiconductor substrate, each bonding pad receiving the same control signal, a plurality of input buffer circuits provided corresponding to said plurality of bonding pads and formed on the surface of said semiconductor substrate, each for receiving said control signal at an input node and providing a signal according to said control signal to an output node, and a plurality of interconnection layers of a metal layer provided corresponding to said plurality of input buffer circuits and formed on the insulating layer on the surface of said semiconductor substrate, each interconnection layer electrically connecting an input node of a corresponding input buffer circuit with a corresponding bonding pad, a lead terminal provided corresponding to said plurality of bonding pads for receiving said control signal, said lead terminal being provided at a center line parallel to the longer side of the semiconductor chip, and a plurality of metal wires provided corresponding to each of said plurality of bonding pads, each metal wire electrically connecting a corresponding bonding pad with said lead terminal.

19. The semiconductor device according to claim 18, wherein said semiconductor chip further includes an output interconnection layer of a metal layer formed on the insulating layer on the surface of said semiconductor substrate for electrically connecting output nodes of said plurality of input buffer circuits.

20. The semiconductor device according to claim 18, wherein said lead terminal includes a lead segment for receiving externally applied said control signal at one end, and a connection segment formed integral with the other end of said lead segment, located parallel to the longer side of said semiconductor substrate and at a center portion of said semiconductor substrate.

21. The semiconductor device according to claim 20, wherein said semiconductor chip further includes an output interconnection layer formed on the insulating layer on the surface of said semiconductor substrate for electrically connecting output nodes of said plurality of input buffer circuits.

22. The semiconductor device according to claim 20, wherein said lead segment of said lead terminal includes first and second sections in close proximity to respective shorter sides of said semiconductor substrate for receiving externally applied said control signal at one end, and wherein said connection segment of said lead terminal is located between the other ends of said first and second sections of said lead segment.

23. The semiconductor device according to claim 22, wherein said semiconductor chip further includes an output interconnection layer formed on the insulating layer on the surface of said semiconductor substrate for electrically connecting output nodes of said plurality of input buffer circuits.

24. A semiconductor device comprising:

a semiconductor chip including a rectangular semiconductor substrate having shorter sides and longer sides, a plurality of bonding pads formed on an insulating layer on a surface of said semiconductor substrate, and including a longer side row and a shorter side row of bonding pads arranged along a center line parallel to the longer side of said semiconductor substrate and a center line parallel to the shorter side of said semiconductor substrate, the same control signal being applied to a predetermined number of bonding pads of said longer side row and a predetermined number of bonding pads of said shorter side row, a plurality of input buffer circuits provided corresponding to said predetermined number of bonding pads of said longer side row and shorter side row and formed on the surface of said semiconductor substrate, each for receiving said control signal at an input node and providing a signal according to said control signal to an output node, and a plurality of interconnection layers provided corresponding to said plurality of input buffer circuits and formed on the insulating layer on the surface of said semiconductor substrate, each interconnection layer electrically connecting an input node of a corresponding input buffer circuit with a corresponding bonding pad, a lead terminal receiving said control signal, provided corresponding to said predetermined number of bonding pads in said longer side row and shorter side row of bonding pads, said lead terminal being provided at a center line parallel to the longer side of the semiconductor chip, a plurality of metal wires provided corresponding to said predetermined number of bonding pads of said longer side row and shorter side row of said plurality of bonding pads, each metal wire electrically connecting a corresponding bonding pad with said lead terminal.

25. The semiconductor device according to claim 24, wherein said lead terminal includes a lead segment for receiving externally applied said control signal at one end, and a connection segment formed integral with the other end of said lead terminal and located parallel to the longer side of said semiconductor substrate and at a central portion of said semiconductor substrate.

26. The semiconductor device according to claim 25, wherein said lead segment of said lead terminal includes first and second sections in close proximity to respective shorter sides of said semiconductor substrate for receiving externally applied said control signal at one end, and
   wherein said connection segment of said lead terminal is located between the other ends of said first and second sections of said lead terminal.

27. The semiconductor device according to claim 26, wherein said semiconductor chip further includes an output interconnection layer formed of a metal layer on the insulating layer of said surface of said semiconductor substrate for electrically connecting output nodes of said plurality of input buffer circuits.

28. A semiconductor device comprising:
   a semiconductor chip including
      a rectangular semiconductor substrate having longer sides and shorter sides,
      a plurality of bonding pads formed on an insulating layer on a surface of said semiconductor substrate, and arranged at four corners of said semiconductor substrate, each receiving the same control signal,
      a plurality of input buffer circuits provided corresponding to said plurality of bonding pads and formed on the surface of said semiconductor substrate, each for receiving said control signal at an input node and providing a signal according to said control signal to an output node, and
      a plurality of interconnection layers of a metal layer provided corresponding to said plurality of input buffer circuits and formed on the insulating layer on the surface of said semiconductor substrate, each interconnection layer electrically connecting an input node of a corresponding input buffer circuit with a corresponding bonding pad,
   a lead terminal provided corresponding to said plurality of bonding pads, and including a lead segment having first and second sections in close proximity to respective shorter sides of said semiconductor substrate for receiving externally applied said control signal at one end, and a connection segment formed integral with said lead segment and located between the other ends of said first and second sections, and
   a plurality of metal wires provided corresponding to said plurality of bonding pads, each metal wire electrically connecting a corresponding bonding pad with said lead terminal.

29. A semiconductor device comprising:
   a first semiconductor chip including
      a first bonding pad formed on an insulating layer on a surface of a first semiconductor substrate for receiving a control signal,
      a first input buffer provided corresponding to said first bonding pad and formed on the surface of said first semiconductor substrate for receiving said control signal at an input node and providing a signal according to said control signal to an output node, and
      a first interconnection of a metal layer provided corresponding to said first input buffer circuit and formed on the insulating layer on the surface of said first semiconductor substrate for electrically connecting an input node of said first input buffer circuit with a corresponding bonding pad; and
   a second semiconductor chip including
      a second bonding pad formed on an insulating layer on a surface of a second semiconductor substrate for receiving said control signal,
      a second input buffer circuit provided corresponding to said second bonding pad and formed on the surface of said semiconductor substrate for receiving said control signal at an input node and providing a signal according to said control signal to an output node, and
      a second interconnection of a metal layer provided corresponding to said second input buffer circuit and formed on the insulating layer on the surface of said second semiconductor substrate for electrically connecting an input node of said second input buffer circuit with a corresponding bonding pad;
   a lead terminal provided corresponding to said first and second bonding pads for receiving said control signal;
   first and second metal wires provided corresponding to said first and second bonding pads, respectively, each metal wire electrically connecting a corresponding bonding pad with said lead terminal; and
   a metal output interconnection layer formed for electrically connecting output nodes of said first and second input buffer circuits.

30. A semiconductor device comprising:
   a semiconductor chip including
      a plurality of bonding pads formed on an insulating layer on a surface of a semiconductor substrate and formed along the periphery of said semiconductor substrate, each bonding pad receiving the same control signal,
      a plurality of input buffer circuits provided corresponding to said plurality of bonding pads and formed on the surface of said semiconductor substrate, each for receiving said control signal at an input node and providing a signal according to said control signal to an output node, and
      a plurality of interconnection layers of a metal layer provided corresponding to said plurality of input buffer circuits and formed on the insulating layer on the surface of said semiconductor substrate, each interconnection layer electrically connecting an input node of a corresponding input buffer circuit with a corresponding bonding pad,
   lead terminal means provided corresponding to said plurality of bonding pads for receiving said control signal,
   a plurality of metal wires provided corresponding to said plurality of bonding pads, each metal wire electrically connecting a corresponding bonding pad with said lead terminal means, and
   a metal output interconnection layer formed on the insulating layer on the surface of said semiconductor substrate for electrically connecting the output nodes of said plurality of input buffer circuits.

31. The semiconductor device according to claim 30, wherein said lead terminal means comprises
   a first lead terminal provided corresponding to a predetermined number of said plurality of bonding pads, and
   a second lead terminal provided corresponding to said plurality of bonding pads excluding said predetermined number of bonding pads.

* * * * *